United States Patent
Yamamoto et al.

(10) Patent No.: US 9,977,328 B2
(45) Date of Patent: May 22, 2018

(54) CHEMICALLY AMPLIFIED POSITIVE-TYPE PHOTOSENSITIVE RESIN COMPOSITION FOR THICK FILM

(71) Applicant: TOKYO OHKA KOGYO CO., LTD., Kawasaki-shi (JP)

(72) Inventors: Yuta Yamamoto, Kanagawa (JP); Yasushi Kuroiwa, Kanagawa (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days. days.

(21) Appl. No.: 15/006,473

(22) Filed: Jan. 26, 2016

(65) Prior Publication Data
US 2016/0231651 A1 Aug. 11, 2016

(30) Foreign Application Priority Data
Feb. 10, 2015 (JP) ................. 2015-024774

(51) Int. Cl.
*G03F 7/038* (2006.01)
*G03F 7/20* (2006.01)
*G03F 7/32* (2006.01)
*G03F 7/16* (2006.01)

(52) U.S. Cl.
CPC ............. *G03F 7/0382* (2013.01); *G03F 7/16* (2013.01); *G03F 7/20* (2013.01); *G03F 7/32* (2013.01)

(58) Field of Classification Search
None
See application file for complete search history.

(56) References Cited

U.S. PATENT DOCUMENTS

| | | | | |
|---|---|---|---|---|
| 3,000,799 | A * | 9/1961 | Towle | C25D 3/12 205/274 |
| 5,939,242 | A * | 8/1999 | Tang | G03F 7/0045 430/270.1 |
| 6,391,523 | B1 * | 5/2002 | Hurditch | B41C 1/1041 430/19 |
| 9,448,478 | B2 * | 9/2016 | Irie | G03F 7/0397 |
| 2005/0214675 | A1 * | 9/2005 | Watanabe | B41C 1/1008 430/270.1 |
| 2007/0105040 | A1 * | 5/2007 | Toukhy | G03F 7/095 430/270.1 |
| 2010/0248148 | A1 * | 9/2010 | Dazai | C08F 220/38 430/286.1 |
| 2010/0288643 | A1 * | 11/2010 | Niwa | C25D 1/10 205/67 |
| 2011/0117332 | A1 * | 5/2011 | Seong | C08F 212/08 428/195.1 |
| 2013/0095424 | A1 * | 4/2013 | Ichikawa | G03F 7/0397 430/270.1 |
| 2013/0280658 | A1 * | 10/2013 | Maruyama | C07C 309/27 430/285.1 |
| 2014/0083458 | A1 * | 3/2014 | Fuchigami | H01L 21/31133 134/12 |
| 2016/0231651 | A1 * | 8/2016 | Yamamoto | G03F 7/0382 |

FOREIGN PATENT DOCUMENTS

| | | | | |
|---|---|---|---|---|
| EP | 1690685 | * | 8/2006 | ............... B41C 1/10 |
| JP | 05-159996 | * | 6/1993 | |
| JP | H09-176112 | | 7/1997 | |
| JP | H11-052562 | | 2/1999 | |
| JP | 2007-178903 | * | 7/2007 | |
| JP | 2010-185986 | | 8/2010 | |
| JP | 2010-211042 | * | 9/2010 | |
| JP | 2013-125070 | * | 6/2013 | |
| JP | 2013-125146 | * | 6/2013 | |
| JP | 2013-234320 | * | 11/2013 | |
| JP | 2014-067015 | * | 4/2014 | |
| JP | 2014-201555 | * | 10/2014 | |

OTHER PUBLICATIONS

Machine translation of JP 2013-125070 (2013).*

* cited by examiner

*Primary Examiner* — Martin J Angebranndt
(74) *Attorney, Agent, or Firm* — Knobbe Martens Olson & Bear LLP

(57) ABSTRACT

A chemically amplified positive-type photosensitive resin composition for a thick film including an acid generator which is capable of producing an acid when irradiated with an active beam or radiation and includes a compound having a carboxyl group; a resin whose solubility in alkali increases under the action of an acid and which includes an acrylic resin containing a structural unit derived from acrylic ester having a cyclic group containing —$SO_2$— or a cyclic group containing lactone; and an organic solvent.

10 Claims, No Drawings

CHEMICALLY AMPLIFIED POSITIVE-TYPE PHOTOSENSITIVE RESIN COMPOSITION FOR THICK FILM

Priority is claimed on Japanese Patent Application No. 2015-024774, filed on Feb. 10, 2015, the content of which is incorporated herein by reference.

BACKGROUND OF THE INVENTION

Field of the Invention

The present invention relates to a chemically amplified positive-type photosensitive resin composition for a thick film, a method for producing a thick film resist pattern using the chemically amplified positive-type photosensitive resin composition for a thick film, a method for producing a substrate with a mold using the chemically amplified positive-type photosensitive resin composition for a thick film, and a method for producing a plated molded article using the substrate with a mold produced by the method.

Related Art

At present, photofabrication is the mainstream of precise and fine processing technologies. Photofabrication is the general name of a technology in which a photoresist composition is applied to an article surface to be processed to form a photoresist layer, the photoresist layer is patterned by a photolithography technique, and the patterned photoresist layer (resist pattern) is used as a mask to perform chemical etching, electrolytic etching, or electroforming mainly including electroplating, thereby producing various precise parts of a semiconductor package.

In recent years, high density packaging technologies have progressed in semiconductor packages along with downsizing of electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connecting terminals, including protruding electrodes (mounting terminals) such as bumps that protrude above the package, or metal posts or the like that connect rewiring extending from peripheral terminals on the wafer with the mounting terminals, are disposed on the surface of the substrate with high precision.

A photoresist composition is used for photofabrication described above, and as the photoresist composition, a chemically amplified photoresist composition including an acid generator is known (see Japanese Unexamined Patent Application, Publication No. H9-176112, and Japanese Unexamined Patent Application, Publication No. H11-52562). Upon irradiation (exposure) of the chemically amplified photoresist composition with radiation, an acid is produced from an acid generator, diffusion of the acid is promoted by heat treatment, an acid catalytic reaction occurs with respect to a base resin in the composition, and the alkali solubility of the composition is changed.

As the photoresist composition used for photofabrication described above, a photoresist composition for a thick film is exemplified (refer to Japanese Unexamined Patent Application, Publication No. 2010-185986). The photoresist composition for a thick film is used, for example, for forming bumps or metal posts by plating. For example, a thick film photoresist layer having a film thickness of about 20 μm is formed on a support, the layer is exposed to light via a predetermined mask pattern, and developed, thereby forming a resist pattern from which the photoresist layer on an area where the bumps or metal posts are to be formed is selectively removed (peeled off). Then, a conductor such as copper is embedded into the area from which the layer is removed (a non-resist section) by plating, and then the bumps or metal posts can be formed by removing the surrounding resist pattern.

SUMMARY OF THE INVENTION

When a resist pattern is formed using a photoresist composition for a thick film for various purposes including photofabrication, a resist pattern, in which a cross sectional shape of the area removed by development (a non-resist section) is a rectangle, is desired.

In addition, the photoresist composition for a thick film, as disclosed in Japanese Unexamined Patent Application, Publication No. 2010-185986, is usually used in a state of being diluted in a solvent. However, in a case where a thick film resist pattern, for example, having a film thickness of 10 μm or more is formed using a photoresist composition for a thick film including a solvent, there is a problem in that, with respect to a cross section of the resist pattern observed in a direction vertical to the surface direction of the resist pattern, a resist section is pushed out to the non-resist section side in the vicinity of the substrate, so that the width of the non-resist section tends to be narrow. The state where the resist section is pushed out to the non-resist section side in the vicinity of the substrate is referred to as footing.

In this case, when the bumps or metal posts are formed using the resist pattern as a mold, since the contact area between the formed bumps or metal posts and the substrate is small, there is a problem in that the bumps or metal posts tend to fall down or become peeled off from the substrate.

The present invention has been made taking this problem into consideration, and has an object to provide a chemically amplified positive-type photosensitive resin composition for a thick film, which can form a resist pattern including a non-resist section of which the cross sectional shape is excellently rectangular without footing, even in a case where a thick film resist pattern is formed, a method for producing a thick film resist pattern using the chemically amplified positive-type photosensitive resin composition for a thick film, a method for producing a substrate with a mold using the chemically amplified positive-type photosensitive resin composition for a thick film, and a method for producing a plated molded article using the substrate with a mold produced by the method.

The present inventors have found that the problem described above is solved by using a chemically amplified positive-type photosensitive resin composition for a thick film including an (A) acid generator which is capable of producing an acid when irradiated with an active beam or radiation and includes a compound having a carboxyl group; a (B) resin whose solubility in alkali increases under the action of an acid and which includes an (B-3) acrylic resin containing a structural unit derived from acrylic ester having a cyclic group containing —$SO_2$— or a cyclic group containing lactone; and an (S) organic solvent, to thereby complete the present invention.

A first aspect of the invention is a chemically amplified positive-type photosensitive resin composition for a thick film, which is used for forming a thick film resist pattern having a film thickness of 10 μm or more, and includes an (A) acid generator which is capable of producing an acid when irradiated with an active beam or radiation and includes a compound having a carboxyl group; a (B) resin whose solubility in alkali increases under the action of an acid and which includes an (B-3) acrylic resin containing a structural unit derived from acrylic ester having a cyclic group containing —$SO_2$— or a cyclic group containing lactone; and an (S) organic solvent.

A second aspect of the invention is a method for producing a thick film resist pattern, which includes laminating a photosensitive resin layer formed of the chemically amplified positive-type photosensitive resin composition for a thick film according to the first aspect on the substrate; irradiating the photosensitive resin layer with an active beam or radiation; and developing the exposed photosensitive resin layer.

A third aspect of the invention is a method for producing a substrate with a mold, which includes laminating a photosensitive resin layer formed of the chemically amplified positive-type photosensitive resin composition for a thick film according to the first aspect on a metal substrate; irradiating the photosensitive resin layer with an active beam or radiation; and developing the exposed photosensitive resin layer to fabricate a mold for forming a plated molded article.

A fourth aspect of the invention is a method for producing a plated molded article, which includes plating the substrate with a mold produced by the method according to the third aspect to form a plated molded article within the mold.

According to the present invention, it is possible to provide a chemically amplified positive-type photosensitive resin composition for a thick film, which can form a resist pattern including a non-resist section of which the cross sectional shape is excellently rectangular without footing, even in a case where a resist pattern of a thick film is formed, a method for producing a thick film resist pattern using the chemically amplified positive-type photosensitive resin composition for a thick film, a method for producing a substrate with a mold using the chemically amplified positive-type photosensitive resin composition for a thick film, and a method for producing a plated molded article using the substrate with a mold produced by the method.

DETAILED DESCRIPTION OF THE INVENTION

Chemically Amplified Positive-Type Photosensitive Resin Composition

The chemically amplified positive-type photosensitive resin composition (hereinafter, referred to as a photosensitive resin composition) includes an (A) acid generator capable of producing an acid when irradiated with an active beam or radiation (hereinafter, referred to as an (A) acid generator), a (B) resin whose solubility in alkali increases under the action of an acid (hereinafter referred to as a (B) resin), and an (S) organic solvent. The photosensitive resin composition may include at least one component selected from (C) an alkali-soluble resin and (D) an acid diffusion control agent, as necessary.

The photosensitive resin composition is preferably used for forming a thick film resist pattern. The film thickness of a resist pattern formed by using the photosensitive resin composition is, specifically, 10 μm or more, preferably 10 μm to 150 μm, more preferably 20 μm to 120 μm, and particularly preferably 20 μm to 100 μm.

(A) Acid Generator

The (A) acid generator capable of producing an acid when irradiated with an active beam or radiation essentially contains a compound which has a carboxyl group and acts as an acid generator. The (A) acid generator is a compound capable of producing an acid directly or indirectly when irradiated with an active beam or radiation. Since the acid generator having a carboxyl group and the (B-3) acrylic resin containing a structural unit derived from acrylic ester having a cyclic group containing —$SO_2$— or a cyclic group containing lactone are combined to be mixed in the photosensitive resin composition, it is possible to suppress formation of footing in the thick film resist pattern and form a resist pattern including a non-resist section of which the cross sectional shape is excellently rectangular without footing.

A chemical structure of the acid generator having a carboxyl group is not particularly limited, and a structure in which a carboxyl group is introduced into the acid generator capable of producing an acid when irradiated with an active beam or radiation, is preferable, which is known in the related art. The structure of the acid generator having a carboxyl group is represented by the following General formula (a1),

(in the formula (a1), X is a linking group having a valence of t+1, Y is a functional group capable of producing an acid when irradiated with an active beam or radiation, and t and u each independently are an integer of 1 or more).

The functional group capable of producing an acid when irradiated with an active beam or radiation (hereinafter, referred to as a PAG group) is not particularly limited, if the group is a group in which hydrogen atoms in the number of u are removed from the compound capable of producing an acid when irradiated with an active beam or radiation, which is known in the related art.

When the PAG group includes a salt structure, a bonding hand of the PAG group is preferably where a cation constituting the PAG group is bonded.

In the formula (a1), u is preferably an integer of 1 to 3, more preferably 1 or 2, and particularly preferably 1. In the formula (a1), t is preferably an integer of 1 to 4, and more preferably 1 or 2.

As the PAG group Y, a group in which hydrogen atoms in the number of u are removed from cation moiety in the compound represented by following formula (a2) is preferable.

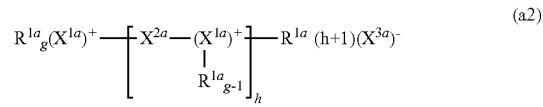

In the formula (a2), $X^{1a}$ represents a sulfur atom having a valence of g or an iodine atom, g is 1 or 2, h represents the number of repeating units in the structure within parentheses, $R^{1a}$ is an organic group that is bonded to $X^{1a}$, and represents an aryl group having 6 to 30 carbon atoms, a heterocyclic group having 4 to 30 carbon atoms, or an alkyl group having 1 to 30 carbon atoms, $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen, the number of $R^{1a}$'s is g+h(g−1)+1, the $R^{1a}$'s may be respectively the same as or different from each other, the two or more $R^{1a}$'s may be bonded to each other directly or via —O—, —S—, —SO—, —SO$_2$—, —NH—, —NR$^{2a}$—, —CO—, —COO—, —CONH—, an alkylene group having 1 to 3 carbon atoms, or a phenylene group, and may form a ring structure containing $X^{1a}$, $R^{2a}$ is an alkyl group having 1 to 5 carbon atoms or an aryl group having 6 to 10 carbon atoms, and $X^{2a}$ is a structure represented by following formula (a3);

(a3)

in the formula (a3), $X^{4a}$ represents an alkylene group having 1 to 8 carbon atoms, an arylene group having 6 to 20 carbon atoms, or a divalent group derived from a heterocyclic compound having 8 to 20 carbon atoms, $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and halogen, $X^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group, h represents the number of repeating units of the structure within parentheses, $X^{4a}$'s in the number of h+1 and $X^{5a}$'s in the number of h may be the same as or different from each other, $R^{2a}$ has the same definition as described above, and $X^{3a-}$ is an organic anion.)

A bonding hand position where the PAG group Y derived from the compound represented by formula (a2) is bonded to a linking group X is not particularly limited.

Hereinafter, the PAG group Y constituting the compound represented by formula (a1) and the linking group X will be described.

(PAG Group Y)

As described above, the PAG group Y is a group in which hydrogen atoms in the number of u are removed from cation moiety in the compound represented by the following formula (a2).

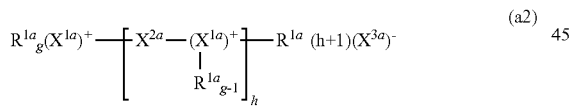
(a2)

The definition of respective abbreviations in formula (a2) is as described above.

Examples of the onium ion in the compound represented by the formula (a2) which imparts the PAG group include triphenylsulfonium, tri-p-tolylsulfonium, 4-(phenylthio)phenyldiphenylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, 4-(4-benzoyl-2-chlorophenylthio)phenylbis(4-fluorophenyl)sulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio)phenyldiphenylsulfonium, diphenylphenacylsulfonium, 4-hydroxyphenylmethylbenzylsulfonium, 2-naphthylmethyl(1-ethoxycarbonyl)ethylsulfonium, 4-hydroxyphenylmethylphenacylsulfonium, phenyl[4-(4-biphenylthio)phenyl]4-biphenylsulfonium, phenyl[4-(4-biphenylthio)phenyl]3-biphenylsulfonium, [4-(4-acetophenylthio)phenyl]diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

Among the onium ions in the compound represented by the formula (a2), as a preferable onium ion, a sulfonium ion represented by the following formula (a4) can be exemplified.

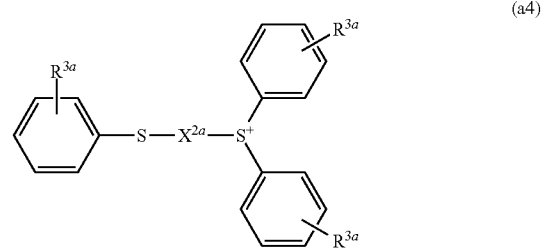
(a4)

In the formula (a4), $R^{3a}$'s each independently represent a hydrogen atom, or a group selected from the group consisting of an alkyl group, a hydroxy group, an alkoxy group, an alkylcarbonyl group, an alkylcarbonyloxy group, an alkyloxycarbonyl group, a halogen atom, an aryl group which may have a substituent, and an arylcarbonyl group. $X^{2a}$ has the same definition as $X^{2a}$ in the formula (a2).

In order to easily synthesize the compound represented by formula (a1), and easily obtain a photosensitive resin composition which can form a resist pattern having a desired cross sectional shape, among the onium ions represented by the formula (a4), the onium ion represented by the following formula (a5) is preferable, and the onium ion represented by the following formula (a5-1) is more preferable.

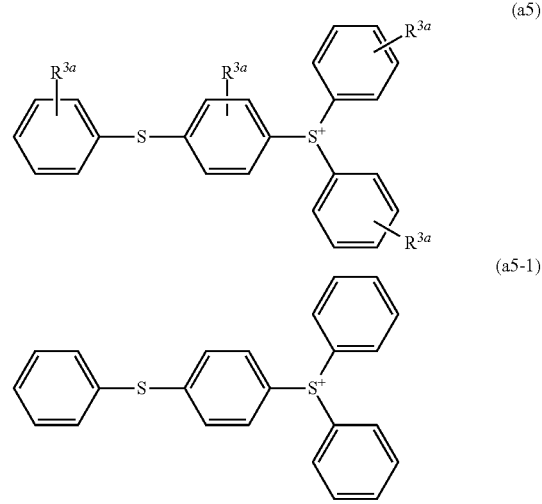
(a5)

(a5-1)

In the formula (a5), $R^{3a}$'s have the same definition as $R^{3a}$'s in the formula (a4).

Examples of the sulfonium ion represented by the formula (a4) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]4-biphenylsulfonium, phenyl[4-(4-biphenylthio)phenyl]3-biphenylsulfonium, [4-(4-acetophenylthio)phenyl]diphenylsulfonium, and diphenyl[4-(p-terphenylthio)phenyl]diphenylsulfonium.

$X^{3a-}$ is an organic anion. The organic anion may be appropriately selected from the anions constituting the onium salt-based acid generator, which is known in the related art.

Preferable examples of the anion as the $X^{3a-}$ include a fluorinated alkylfluorophosphoric acid anion represented by the following formula (a6);

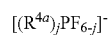  (a6)

a borate anion represented by the following formula (a7);

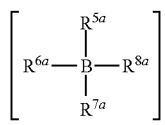  (a7)

fluoroalkylsulfonic acid ions, of which hydrogen atom(s) is partially or entirely fluorinated, or aryl sulfonic acid ions; and an anion selected from the group consisting of nitrogen-containing anions represented by the following formulas (a8) and (a9).

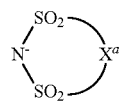  (a8)

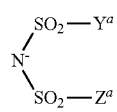  (a9)

In the formula (a6), $R^{4a}$ represents an alkyl group in which 80% or more of hydrogen atoms are substituted with fluorine atoms, j represents the number of $R^{4a}$ and is an integer of 1 to 5, and the $R^{4a}$'s in the number of j may be respectively the same as or different from each other.

In regard to the fluorinated alkylfluorophosphoric acid anion represented by the formula (a6), $R^{4a}$ represents an alkyl group substituted with a fluorine atom, and the preferable number of carbon atoms is 1 to 8, and the more preferable number of carbon atoms is 1 to 4. Examples of the alkyl group include linear alkyl groups such as methyl, ethyl, propyl, butyl, pentyl and octyl; branched alkyl groups such as isopropyl, isobutyl, sec-butyl, and tert-butyl; and cycloalkyl groups such as cyclopropyl, cyclobutyl, cyclopentyl, and cyclohexyl. The ratio of hydrogen atoms substituted with fluorine atoms in the alkyl groups is usually 80% or more, preferably 90% or more, and still more preferably 100%. If the substitution ratio of fluorine atoms is less than 80%, the acid strength of the onium fluorinated alkylfluorophosphate represented by the formula (a1) decreases.

A particularly preferable example of $R^{4a}$ is a linear or branched perfluoroalkyl group having 1 to 4 carbon atoms and a substitution ratio of fluorine atoms of 100%, and the specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. The number of $R^{3a}$'s, j, is an integer from 1 to 5, preferably 2 to 4, and particularly preferably 2 or 3.

Preferable examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, and $[(CF_3CF_2CF_2)_3PF_3]^-$, and among these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$ are particularly preferable.

In the formula (a7), $R^{5a}$ to $R^{8a}$ each independently represent a fluorine atom or a phenyl group, hydrogen atom(s) of the phenyl group may be partially or entirely substituted with at least one selected from the group consisting of a fluorine atom and a trifluoromethyl group.

Preferable examples of the borate anion represented by the formula (a7) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), and tetrakis(difluorophenyl)borate ($[B(C_6H_3F_2)_4]^-$). Among these, tetrakis(pentafluorophenyl)borate ($[B(C_6F_5)_4]^-$) is particularly preferable.

The alkyl group in the fluoroalkylsulfonic acid ions of which hydrogen atom(s) is partially or entirely fluorinated may be linear, branched, or cyclic and have 1 to 20 carbon atoms. Preferably, the number of carbon atoms is 1 to 10 in view of bulkiness and diffusion distance of the produced acid. In particular, Branched or cyclic groups are preferable since they have shorter diffusion length. Also, a methyl group, an ethyl group, a propyl group, a butyl group, and an octyl group may be preferably exemplified since they can be synthesized inexpensively.

The aryl group in the aryl sulfonic acid ions may be an aryl group having 6 to 20 carbon atoms, and examples thereof include a phenyl group and a naphthyl group, which may be substituted or unsubstituted with an alkyl group or a halogen atom. In particular, aryl groups having 6 to 10 carbon atoms are preferable since they can be synthesized inexpensively. Preferable examples of the aryl group include a phenyl group, a toluenesulfonyl group, an ethylphenyl group, a naphthyl group, and a methylnaphthyl group.

In the case where hydrogen atoms in the fluoroalkylsulfonic acid ion or the aryl sulfonic acid ion are partially or entirely substituted with a fluorine atom, the fluorination ratio is preferably 10% to 100%, and more preferably 50% to 100%; it is particularly preferable that all hydrogen atoms be each substituted with a fluorine atom since acid strength becomes greater. Examples thereof include trifluoromethane sulfonate, perfluorobutane sulfonate, perfluorooctane sulfonate, and perfluorobenzene sulfonate.

In the fluoroalkylsulfonic acid ion or the aryl sulfonic acid ion, a preferable anion moiety may be represented by the following formula (a10).

  (a10)

In the formula (a10), $R^{9a}$ is a group represented by the following formula (a11), (a12), or (a13);

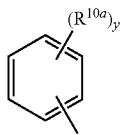
(a11)

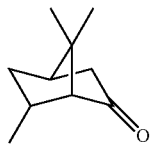
(a12)

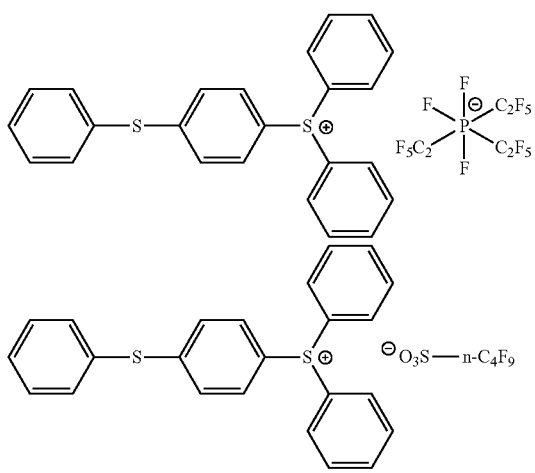
(a13)

in the formula (a11), x represents an integer of 1 to 4, in the formula (a12), $R^{10a}$ represents a hydrogen atom, a hydroxyl group, a linear or branched alkyl group having 1 to 6 carbon atoms, or a linear or branched alkoxy group having 1 to 6 carbon atoms, and y represents an integer of 1 to 3.

In the formulas (a8) and (a9), $X^a$ represents a linear or branched alkylene group of which at least one hydrogen atom is substituted with a fluorine atom, and which has 2 to 6 carbon atoms. $Y^a$ and $Z^a$ each independently represent a linear or branched alkyl group of which at least one hydrogen atom is substituted with a fluorine atom, and which has 1 to 10 carbon atoms. When $Y^a$ and $Z^a$ are an alkyl group substituted with a fluorine atom, the number of carbon atoms of the alkyl group is preferably 1 to 7, and more preferably 1 to 3.

The smaller number of carbon atoms in the alkylene group of $X^a$, or in the alkyl group of $Y^a$ or $Z^a$ is preferable since the solubility into organic solvent is preferable.

In addition, the larger number of hydrogen atoms each substituted with a fluorine atom in the alkylene group of $X^a$, or in the alkyl group of $Y^a$ or $Z^a$ is preferable since the acid strength becomes greater. The ratio of fluorine atoms in the alkylene group or an alkyl group, i.e., the fluorination ratio is preferably 70% to 100% and more preferably 90% to 100%, and the most preferable are perfluoroalkylene or perfluoroalkyl groups in which all of the hydrogen atoms are each substituted with a fluorine atom.

Preferable examples of the compound represented by the formula (a2) which imparts the preferable PAG group Y described above are represented by the following formulas.

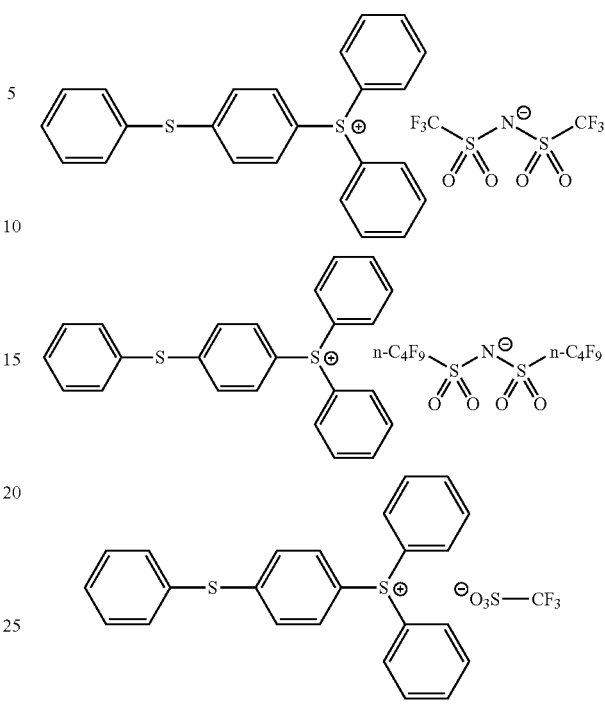

As described above, in the formula (a1), u is particularly preferably 1. In other words, the PAG group Y is particularly preferably a monovalent group. Preferable examples of the PAG group Y include the following groups, in a case where the PAG group Y is a monovalent group derived from the compound exemplified as the preferable specific example of the compound represented by the formula (a2).

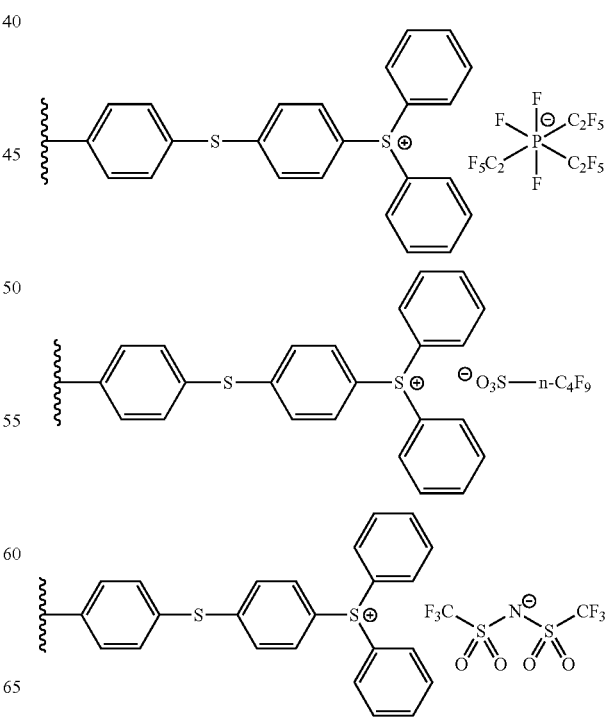

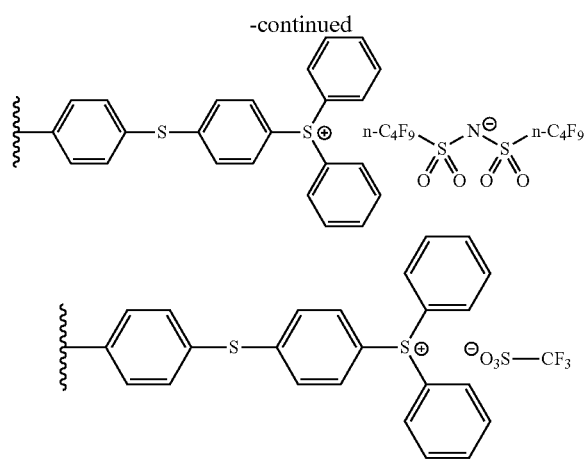

Linking Group X

X is a linking group having a valence of t+1, and may be single bond or an organic group having a valence of t+1. The organic group having a valence of t+1 may be a hydrocarbon group, or an organic group including a hetero atom such as O, N, S, P, and a halogen atom.

Preferable examples of the linking group X include groups represented by the following formula (a14). In addition, in the formula (a14), a bonding hand marked with "*" is where the PAG group Y is bonded.

$$-(R^{11a})-(R^{13a}-R^{12a})_s-* \quad (a14)$$

In the formula (a14), $R^{11a}$ and $R^{12a}$ each independently represent single bond or a divalent group selected from the group consisting of —O—, —CO—, —COO—, —OCO—, —OCOO—, —NH—, —CONH—, —NHCO—, —NHCONH—, —S—, —SO—, and —SO$_2$—. $R^{13a}$ represents a divalent or higher valent aliphatic hydrocarbon group, a divalent or higher valent aromatic hydrocarbon group, a divalent or higher valent heterocyclic group, or a group in which two or more of these groups are combined. These groups exemplified as an option of $R^{13a}$ may have substituent. S represents an integer of 0 or more, and is preferably an integer of 0 to 2, more preferably 0 or 1, and particularly preferably 1.

In the formula (a14), when $R^{13a}$ is a trivalent or higher valent organic group, a description of the bonding hand of $R^{13a}$ is omitted except the bonding of $R^{13a}$ with $R^{11a}$ and $R^{12a}$.

When s is 2 or more, a plurality of $R^{12a}$'s and $R^{13a}$'s included in the group represented by the formula (a14) may be the same as or different from each other.

Examples of the substituent which $R^{13a}$ may have include at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen.

Preferable examples of the group represented by —X—(COOH)$_t$ in the compound represented by the formula (a1) include groups represented by following formula (a14-1). In the formula (a14-1), a bonding hand marked with "*" is where the PAG group Y is bonded.

$$(HOCO)_t-R^{14a}-CO-* \quad (a14-1)$$

As described above, in the formula (a1), t is preferably 1 or 2. When t is 1, $R^{14a}$ is preferably an alkylene group having 1 to 8 carbon atoms, a phenylene group, or a naphthalene diyl group, more preferably an alkylene group having 1 to 4 carbon atoms, a phenylene group, or a naphthalene diyl group, and particularly preferably a 1,2-ethane diyl group, a p-phenylene group, or a m-phenylene group.

When t is 2 in the formula (a1), $R^{14a}$ is preferably a trivalent chain-like aliphatic group, a benzene triyl group, or a naphthalene triyl group, more preferably a 1,2,4-benzene triyl group, a 1,2,5-benzene triyl group, or a 1,3,4-benzene triyl group, and particularly preferably a 1,2,4-benzene triyl group.

The 1,2,4-benzene triyl group, 1,2,5-benzene triyl group, or 1,3,4-benzene triyl group is bonded to a carbonyl group at 1 position in the group represented by the formula (a14-1).

As a compound represented by the formula (a1) and having a preferable linking group X, the following compound can be exemplified.

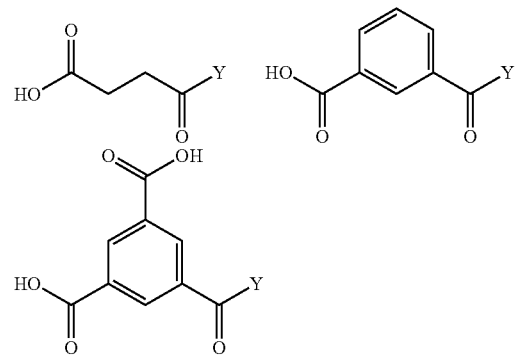

Preferable examples of the compound represented by the formula (a1) include the following PAG-A to PAG-E.

PAG-A

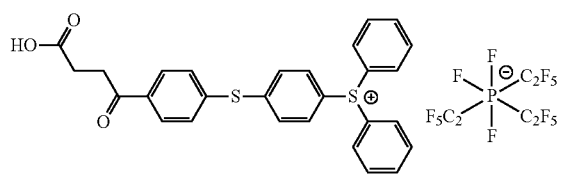

PAG-B

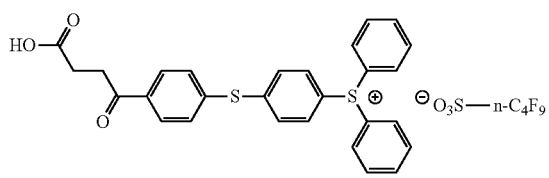

PAG-C

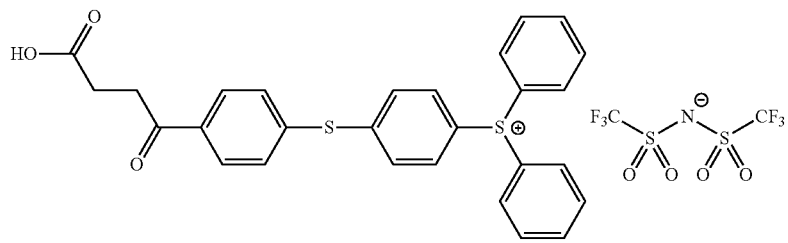

PAG-D

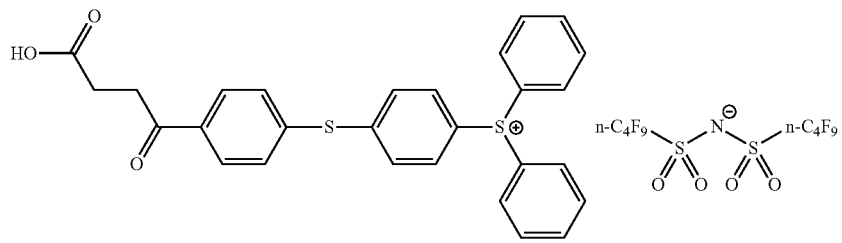

PAG-E

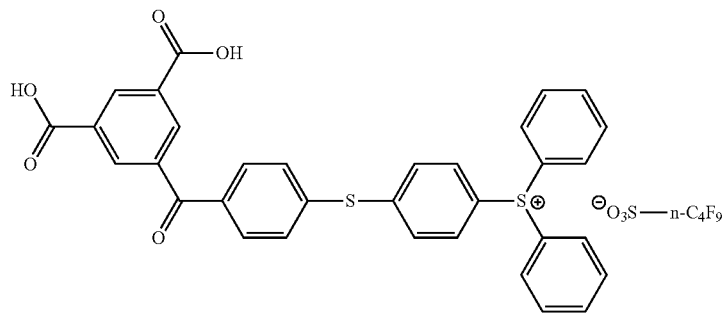

The (A) acid generator may include an acid generator not having a carboxyl group, in addition to the acid generator having a carboxyl group described above. In this case, the content of the acid generator having a carboxyl group with respect to the total amount of the (A) acid generator is preferably 50 mass % or more, more preferably 70 mass % or more, particularly preferably 90 mass % or more, and the most preferably 100 mass %.

As the acid generator not having a carboxyl group, an acid generator of first to fifth aspects described below is preferable. Hereinafter, the first to fifth aspect of the preferable acid generator among the acid generators preferably used in the photosensitive resin composition will be described.

The first aspect of the acid generator not having a carboxyl group includes a compound represented by the formula (a2).

The second aspect of the acid generator not having a carboxyl group includes halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl) ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl) ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl) ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl) ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl) ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following formula (a15) such as tris(2,3-dibromopropyl) isocyanurate.

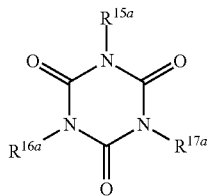

(a15)

In the formula (a15), $R^{15a}$, $R^{16a}$, and $R^{17a}$ each independently represent a halogenated alkyl group.

The third aspect of the acid generator not having a carboxyl group includes α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following formula (a16) having an oximesulfonate group.

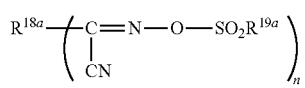

(a16)

In the formula (a16), $R^{18a}$ represents a monovalent, divalent or trivalent organic group, $R^{19a}$ represents a substituted or unsubstituted saturated hydrocarbon group, an unsaturated hydrocarbon group, or an aromatic compound group, and n represents the number of repeating units of the structure in the parentheses.

In the formula (a16), the aromatic compound group indicates a compound group having physical and chemical properties of aromatic compounds, and examples thereof include aryl groups such as a phenyl group and a naphthyl group, and heteroaryl groups such as a furyl group and a thienyl group. These may have one or more appropriate substituents such as a halogen atom, an alkyl group, an alkoxy group, and a nitro group on the rings. $R^{19a}$ is particularly preferably an alkyl group having 1 to 6 carbon atoms and the examples thereof include a methyl group, an ethyl group, a propyl group, and a butyl group. In particular, compounds in which $R^{18a}$ represents an aromatic compound group and $R^{19a}$ represents an alkyl group having 1 to 4 carbon atoms are preferable.

Examples of the acid generator represented by the formula (a16) include compounds in which $R^{18a}$ is any one of a phenyl group, a methylphenyl group, and a methoxyphenyl group, and $R^{19a}$ is a methyl group, when n is 1, and the specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, and [2-(propylsulfonyloxyimino)-2,3-dihydroxythiophene-3-ylidene](o-tolyl)acetonitrile. When n is 2, specific examples of the acid generator represented by the formula (b2) include acid generators represented by the following formulae.

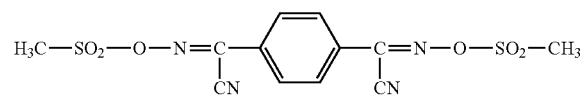

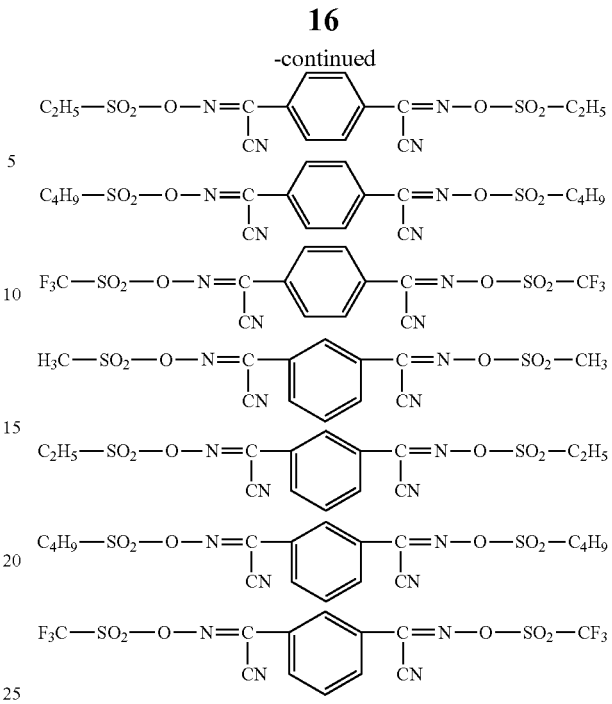

The fourth aspect of the acid generator not having a carboxyl group may include an onium salt having a naphthalene ring at their cation moiety. The expression "having a naphthalene ring" indicates having a structure derived from naphthalene and also indicates at least two ring structures and their aromatic properties are maintained. The naphthalene ring may have a substituent such as a linear or branched alkyl group having 1 to 6 carbon atoms, a hydroxyl group, and a linear or branched alkoxy group having 1 to 6 carbon atoms. The structure derived from the naphthalene ring, which may be a monovalent group (one free valance) or a divalent group (two free valences) or higher valent group, is desirably of a monovalent group (in this regard, the number of free valance is counted except for the portions connecting with the substituents as described above). The number of naphthalene rings is preferably 1 to 3.

The cation moiety of the onium salt having a naphthalene ring at such a cation moiety is preferably a structure represented by the following formula (a17).

(a17)

In the formula (a17), at least one of $R^{20a}$, $R^{21a}$, and $R^{22a}$ represents a group represented by the following formula (a18), and the remaining represents a linear or branched alkyl group having 1 to 6 carbon atoms, a phenyl group which may have a substituent, a hydroxyl group, or a linear or branched alkoxy group having 1 to 6 carbon atoms. Alternatively, one of $R^{20a}$, $R^{21a}$, and $R^{22a}$ is a group represented by the following formula (a18), and the remaining two are each independently a linear or branched alkylene group having 1 to 6 carbon atoms, and terminals thereof may be bonded to each other to form a ring structure.

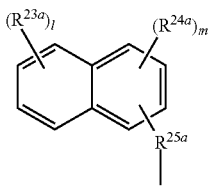
(a18)

In the formula (a18), $R^{23a}$ and $R^{24a}$ each independently represent a hydroxyl group, a linear or branched alkoxy group having 1 to 6 carbon atoms, or a linear or branched alkyl group having 1 to 6 carbon atoms, and $R^{25a}$ represents single bond or a linear or branched alkylene group having 1 to 6 carbon atoms that may have a substituent. l and m each independently represent an integer of 0 to 2, and l+m is 3 or less. Here, when there exist a plurality of $R^{23a}$'s, they may be the same as or different from each other. Further, when there exist a plurality of $R^{24a}$'s, they may be the same as or different from each other.

Preferably, among $R^{20a}$, $R^{21a}$, and $R^{22a}$ as above, the number of groups represented by the formula (a18) is one in view of the stability of the compound, and the remaining are linear or branched alkylene groups having 1 to 6 carbon atoms of which the terminals may be bonded to each other to form a ring. In this case, the two alkylene groups described above form a 3- to 9-membered ring including sulfur atom(s). The number of atoms which form the ring (including sulfur atom(s)) is preferably 5 or 6.

Furthermore, the examples of the substituent which the alkylene group may have include an oxygen atom (in this case, a carbonyl group is formed together with a carbon atom that constitutes the alkylene group) and a hydroxyl group.

Incidentally, the examples of the substituent which the phenyl group may have include a hydroxyl group, a linear or branched alkoxy group having 1 to 6 carbon atoms and a linear or branched alkyl group having 1 to 6 carbon atoms.

Preferable examples of the cation moiety include those represented by the following formulas (a19) and (a20), and the structure represented by the following formula (a20) is particularly preferable.

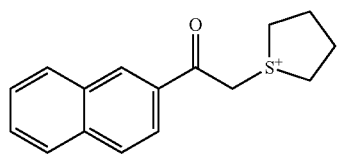
(a19)

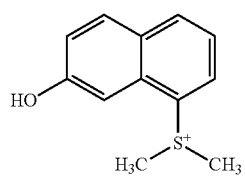
(a20)

The cation moiety may be an iodonium salt or a sulfonium salt, but is desirably a sulfonium salt in view of acid-producing efficiency or the like.

Therefore, a preferable anion moiety of the onium salt having a naphthalene ring at the cation moiety is desirably an anion capable of forming a sulfonium salt.

As the anion moiety of the acid generator, fluoroalkylsulfonic acid ions of which hydrogen atom(s) is partially or entirely fluorinated or aryl sulfonic acid ions, and anions represented by the formulas (a8) and (a9) are preferable. As the fluoroalkylsulfonic acid ions of which hydrogen atom(s) is partially or entirely fluorinated or aryl sulfonic acid ions, an anion represented by the formula (a10) is preferable.

Preferable examples of the onium salt having a naphthalene ring at the cation moiety include compounds represented by the following formulas (a21) and (a22).

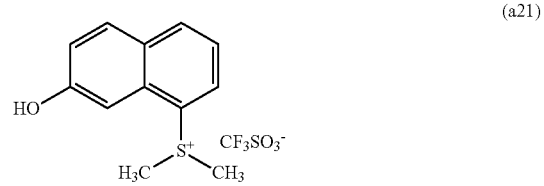
(a21)

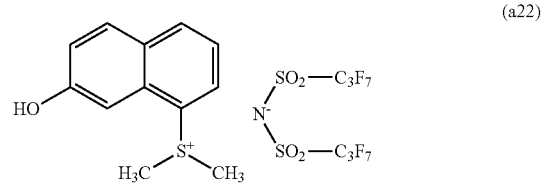
(a22)

The fifth aspect of the acid generator not having a carboxyl group may include bissulfonyldiazomethanes such as bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate, and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide, and N-methylsulfonyloxyphthalimide; trifluoromethane sulfonates such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate, and (p-tert-butylphenyl)diphenylsulfonium trifluoromethanesulfonate; benzointosylates such as benzointosylate and α-methylbenzointosylate; and other diphenyliodonium salts, triphenylsulfonium salts, phenyldiazonium salts, and benzylcarbonates.

When the acid generator is mixed in the photosensitive resin composition, an acid generator (B) may be used alone or in combination of two or more types thereof. The content of the acid generator (B) with respect to the total mass of the photosensitive resin composition is preferably 10 mass % or less, and more preferably 3 mass % or less. In addition, the lower limit of the content with respect to the total mass of the photosensitive resin composition may be 0.1 mass % or more, 0.5 mass % or more, or 1 mass % or more.

The content of the (A) acid generator with respect to the total mass of the photosensitive resin composition is preferably 0.1 mass % to 10 mass %, and more preferably 0.5 mass % to 3 mass %. By setting the use amount of the (A) acid generator within the range described above, it is easy to prepare a photosensitive resin composition having excellent sensitivity and storage stability as a uniform solution.

(B) Resin

A (B) resin whose solubility in alkali increases under the action of an acid includes an (B-3) acrylic resin containing a structural unit derived from acrylic ester having a cyclic group containing —$SO_2$— or a cyclic group containing lactone (hereinafter, referred to as an (B-3) acrylic resin). Since the photosensitive resin composition contains the (B-3) acrylic resin, it is possible to form a thick film pattern of which a cross sectional shape is excellent and the film thickness is 10 μm or more. In addition, the (B) resin whose solubility in alkali increases under the action of an acid may contain a resin other than the (B-3) acrylic resin described above, which is mixed in the positive-type photosensitive resin composition from the related art.

The content of the (B-3) acrylic resin of the total resin components included in the photosensitive resin composition is 70 mass % or more, preferably 90 mass % or more, and more preferably 100 mass % with respect to the total mass of the (B) resin whose solubility in alkali increases under the action of an acid and (D) an alkali-soluble resin described below.

Hereinafter, as a preferable example of the (B) resin whose solubility in alkali increases under the action of an acid, (B1) a novolac resin, (B2) a polyhydroxystyrene resin, and (B3) an acrylic resin will be described.

(B1) Novolac Resin

As (B1) the novolac resin, a resin including a structural unit represented by the following formula (b1) can be used.

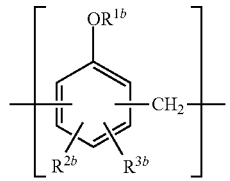
(b1)

In the formula (b1), $R^{1b}$ represents an acid-dissociative dissolution-controlling group, and $R^{2b}$ and $R^{3b}$ each independently represent a hydrogen atom or an alkyl group having 1 to 6 carbon atoms.

The acid-dissociative dissolution-controlling group represented by the $R^{1b}$ is preferably a group represented by the following formula (b2) or (b3), a linear, branched, or cyclic alkyl group having 1 to 6 carbon atoms, a vinyloxyethyl group, a tetrahydropyranyl group, a tetrafuranyl group, or a trialkylsilyl group.

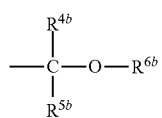
(b2)

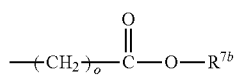
(b3)

In the formulae (b2) and (b3), $R^{4b}$ and $R^{5b}$ each independently represent a hydrogen atom, or a linear or branched alkyl group having 1 to 6 carbon atoms, $R^{6b}$ represents a linear, branched, or cyclic alkyl group having 1 to 10 carbon atoms, and $R^{7b}$ represents a linear, branched, or cyclic alkyl group having 1 to 6 carbon atoms, and o represents 0 or 1.

Examples of the linear or branched alkyl group include a methyl group, an ethyl group, a propyl group, an isopropyl group, an n-butyl group, an isobutyl group, a tert-butyl group, a pentyl group, an isopentyl group, and a neopentyl group. Also, the examples of the cyclic alkyl group include a cyclopentyl group and a cyclohexyl group.

Examples of the acid-dissociative dissolution-controlling group represented by the formula (b2) include a methoxyethyl group, an ethoxyethyl group, an n-propoxyethyl group, an isopropoxyethyl group, an n-butoxyethyl group, an isobutoxyethyl group, a tert-butoxyethyl group, a cyclohexyloxyethyl group, a methoxypropyl group, an ethoxypropyl group, a 1-methoxy-1-methyl-ethyl group, and a 1-ethoxy-1-methylethyl group. Further, the specific examples of the acid-dissociative dissolution-controlling group represented by the formula (b3) include a tert-butoxycarbonyl group and a tert-butoxycarbonylmethyl group. Examples of the trialkylsilyl group include a trimethylsilyl group and a tri-tert-butyldimethylsilyl group, in which each alkyl group has 1 to 6 carbon atoms.

(B2) Polyhydroxystyrene Resin

As the (B2) polyhydroxystyrene resin, a resin including the structural unit represented by the following formula (b4) can be used.

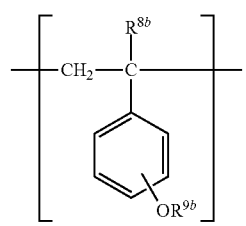
(b4)

In the formula (b4), $R^{8b}$ represents a hydrogen atom or an alkyl group having 1 to 6 carbon atoms, and $R^{9b}$ represents an acid-dissociative dissolution-controlling group.

The alkyl group having 1 to 6 carbon atoms may include, for example, linear, branched, or cyclic alkyl groups having 1 to 6 carbon atoms. Examples of the linear or branched alkyl group include a methyl group, an ethyl group, a propyl group, an isopropyl group, an n-butyl group, an isobutyl group, a tert-butyl group, a pentyl group, an isopentyl group, and a neopentyl group, and examples of the cyclic alkyl group include a cyclopentyl group and a cyclohexyl group.

The acid-dissociative dissolution-controlling group represented by the $R^{9b}$ may be similar to the acid-dissociative dissolution-controlling groups exemplified in terms of the formulas (b2) and (b3).

Furthermore, the polyhydroxystyrene resin (B2) may include another polymerizable compound as a structural unit in order to moderately control physical or chemical properties. Examples of the polymerizable compound include conventional radical polymerizable compounds and anion polymerizable compounds. Examples of the polymerizable compound include monocarboxylic acids such as acrylic acid, methacrylic acid, and crotonic acid; dicarboxylic acids such as maleic acid, fumaric acid, and itaconic acid; methacrylic acid derivatives having a carboxyl group and an ester bond, such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; alkyl (meth)acrylic esters such as methyl (meth)acrylate, ethyl (meth)acrylate, and butyl (meth) acrylate; hydroxyalkyl (meth)acrylic esters such as 2-hydroxyethyl (meth)acrylate and 2-hydroxypropyl (meth) acrylate; aryl (meth)acrylic esters such as phenyl (meth) acrylate and benzyl (meth)acrylate; dicarboxylic diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

(B3) Acrylic Resin

As described above, the photosensitive resin composition essentially contains the (B-3) acrylic resin containing a structural unit derived from acrylic ester having a cyclic group containing —$SO_2$— or a cyclic group containing lactone. Therefore, as the (B3) acrylic resin, the (B-3) acrylic resin containing a structural unit derived from acrylic ester having a cyclic group containing —$SO_2$— or a cyclic group containing lactone is preferable. Hereinafter, as the preferable (B3) acrylic resin, the (B-3) acrylic resin, which is a preferable resin, will be described.

(B-3) Acrylic Resin

The (B-3) acrylic resin includes a cyclic group containing —$SO_2$— or a cyclic group containing lactone. Therefore, the (B-3) acrylic resin essentially contains a structural unit (b-3) including a cyclic group containing —$SO_2$— or a cyclic group containing lactone.

Here, the "cyclic group containing —$SO_2$—" indicates a cyclic group containing a ring that includes —$SO_2$— in its ring skeleton, specifically, a cyclic group in which a sulfur atom (S) in —$SO_2$— forms a part of the ring skeleton of the cyclic group. If the ring including —$SO_2$— in its ring skeleton is counted as a first ring and when the group has only one ring, the group is referred to as a monocyclic group, and when the group has another ring structure, the group is referred to as a polycyclic group regardless of its structure. The cyclic group containing —$SO_2$— may be monocyclic or polycyclic.

Particularly, the cyclic group containing —$SO_2$— is a cyclic group containing —O—$SO_2$— in its ring skeleton, in other words, preferably a cyclic group containing a sultone ring in which —O—S— in —O—$SO_2$— forms a part of the ring skeleton.

The number of carbon atoms in the cyclic group containing —$SO_2$— is preferably 3 to 30, more preferably 4 to 20, still more preferably 4 to 15, and particularly preferably 4 to 12. The number of carbon atoms is the number of carbon atoms constituting the ring skeleton, and the number does not include the number of carbon atoms in a substituent.

The cyclic group containing —$SO_2$— may be an alicyclic group containing —$SO_2$—, or an aromatic cyclic group containing —$SO_2$—. The alicyclic group containing —$SO_2$— is preferable.

Examples of the alicyclic group containing —$SO_2$— include a group in which at least one hydrogen atom is removed from an aliphatic hydrocarbon ring of which a part of carbon atoms constituting its ring skeleton is substituted with —$SO_2$— or —O—$SO_2$—. More specifically, the examples thereof include a group in which at least one hydrogen atom is removed from an aliphatic hydrocarbon ring of which —$CH_2$— constituting its ring skeleton is substituted with —$SO_2$—, and a group in which at least one hydrogen atom is removed from an aliphatic hydrocarbon ring of which —$CH_2$—$CH_2$— constituting its ring skeleton is substituted with —O—$SO_2$—.

The number of carbon atoms of the alicyclic hydrocarbon ring is preferably 3 to 20, and more preferably 3 to 12. The alicyclic hydrocarbon ring may be polycyclic or monocyclic. As a monocyclic alicyclic hydrocarbon group, a group in which two hydrogen atoms are removed from monocycloalkane having 3 to 6 carbon atoms is preferable. Examples of the monocycloalkan include cyclopentane and cyclohexane. As a polycyclic alicyclic hydrocarbon ring, a group in which two hydrogen atoms are removed from polycycloalkane having 7 to 12 carbon atoms is preferable, and the specific examples of the polycycloalkane include adamantane, norbornane, isobornane, tricyclodecane, and tetracyclododecane.

The cyclic group containing —$SO_2$— may have a substituent. Examples of the substituent include an alkyl group, an alkoxy group, a halogen atom, a halogenated alkyl group, a hydroxyl group, an oxygen atom (=O), —COOR", —OC(=O)R", a hydroxyalkyl group, and a cyano group.

An alkyl group having 1 to 6 carbon atoms is preferable as the substituent. The alkyl group is preferably a linear or branched-chain group. Specifically, the examples thereof include a methyl group, an ethyl group, an n-propyl group, an isopropyl group, an n-butyl group, an isobutyl group, a tert-butyl group, an n-pentyl group, an isopentyl group, a neopentyl group, and an n-hexyl group. Among these, a methyl group or an ethyl group is preferable, and a methyl group is particularly preferable.

An alkoxy group having 1 to 6 carbon atoms is preferable as the substituent. The alkoxy group is preferably a linear or branched-chain group. Specifically, the examples thereof include a group in which an alkyl group, exemplified as an alkyl group as the substituent, is bonded to an oxygen atom (—O—).

Examples of the halogen atom as the substituent include a fluorine atom, a chlorine atom, a bromine atom, and an iodine atom, and a fluorine atom is preferable.

Examples of the halogenated alkyl group as the substituent include a group in which hydrogen atom(s) of an alkyl group is partially or entirely substituted with the halogen atom.

Examples of the halogenated alkyl group as the substituent include a group in which hydrogen atom(s) of an alkyl group, exemplified as an alkyl group as the substituent, is partially or entirely substituted with the halogen atom. As the halogenated alkyl group, a fluorinated alkyl group is preferable, and a perfluoroalkyl group is particularly preferable.

Any of the R" in —COOR" and —OC(=O)R" is a hydrogen atom or a linear, branched-chain or cyclic alkyl group having 1 to 15 carbon atoms.

When R" is a linear or branched-chain alkyl group, the number of carbon atoms of the chain-like alkyl group is preferably 1 to 10, more preferably 1 to 5, and particularly preferably 1 or 2.

When R" is a cyclic alkyl group, the number of carbon atoms of the cyclic alkyl group is preferably 3 to 15, more preferably 4 to 12, and particularly preferably 5 to 10. Specifically, the examples thereof include a group in which at least one hydrogen atom is removed from polycycloalkane such as monocycloalkane, bicycloalkane, tricycloalkane, and tetracycloalkane, which may be substituted with a fluorine atom or a fluorinated alkyl group. More specifically, the examples thereof include a group in which at least one hydrogen atom is removed from monocycloalkane such as cyclopentane and cyclohexane, or polycycloalkane such as adamantane, norbornane, isobornane, tricyclodecane, and tetracyclododecane.

A hydroxyalkyl group having 1 to 6 carbon atoms is preferable as the substituent. Specifically, the examples thereof include a group in which at least one hydrogen atom of the alkyl group, exemplified as an alkyl group as the substituent, is substituted with a hydroxyl group.

More specifically, the examples of the cyclic group containing —$SO_2$— include groups represented by the following formulas (3-1) to (3-4),

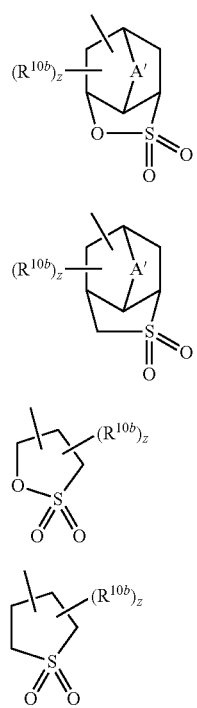

(in the formulas, A' is an alkylene group having 1 to 5 carbon atoms which may include an oxygen atom or a sulfur atom, an oxygen atom, or a sulfur atom, z is an integer of 0 to 2, $R^{10b}$ is an alkyl group, an alkoxy group, a halogenated alkyl group, a hydroxyl group, —COOR", —OC(=O)R", a hydroxyalkyl group, or a cyano group, and R" is a hydrogen atom or an alkyl group).

In the formulas (3-1) to (3-4), A' is an alkylene group having 1 to 5 carbon atoms which may include an oxygen atom (—O—) or a sulfur atom (—S—). As the alkylene group having 1 to 5 carbon atoms in A', a linear or branched-chain alkylene group is preferable, and the examples thereof include a methylene group, an ethylene group, an n-propylene group, and an isopropylene group.

When the alkylene group includes an oxygen atom or a sulfur atom, the specific examples thereof include a group in which —O— or —S— is interposed between carbon atoms or at the terminal of the alkylene group, such as —O—$CH_2$—, —$CH_2$—O—$CH_2$—, —S—$CH_2$—, and —$CH_2$—S—$CH_2$—. As the A', an alkylene group having 1 to 5 carbon atoms or —O— is preferable, an alkylene group having 1 to 5 carbon atoms is more preferable, and a methylene group is the most preferable.

z is any one of 0 to 2, and 0 is the most preferable. When z is 2, a plurality of $R^{10b}$'s are respectively the same as or different from each other.

As an alkyl group, an alkoxy group, a halogenated alkyl group, —COOR", —OC(=O)R", and a hydroxyalkyl group in $R^{10b}$, the above-mentioned groups same as the alkyl group, the alkoxy group, the halogenated alkyl group, —COOR", —OC(=O)R", and the hydroxyalkyl group, which are exemplified as the substituent and may be included in the cyclic group containing —$SO_2$—, can be exemplified respectively.

Hereinafter, specific examples of the cyclic group represented by the formulas (3-1) to (3-4) will be described. In addition, "Ac" in the formula represents an acetyl group.

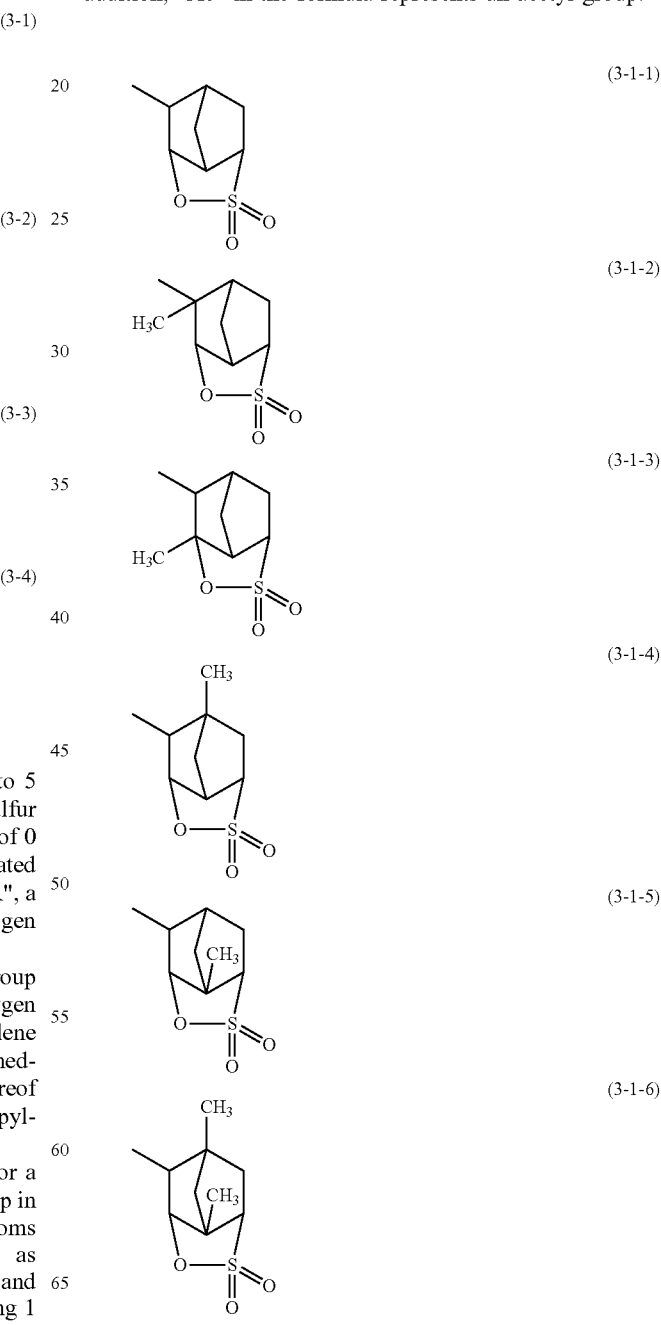

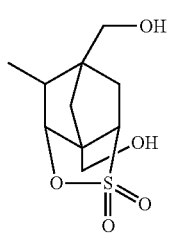 (3-1-7)
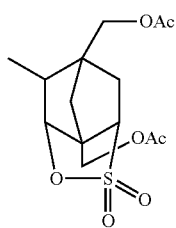 (3-1-8)
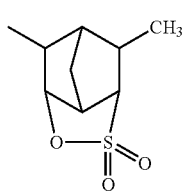 (3-1-9)
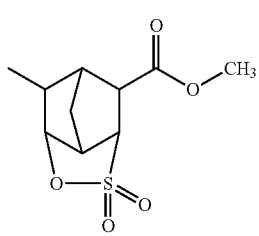 (3-1-10)
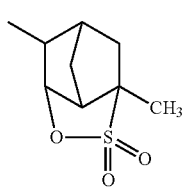 (3-1-11)
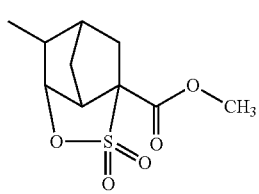 (3-1-12)
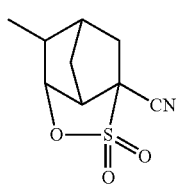 (3-1-13)
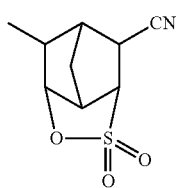 (3-1-14)
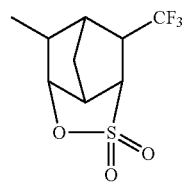 (3-1-15)
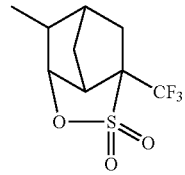 (3-1-16)
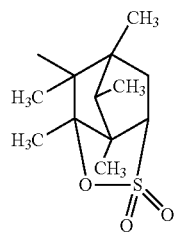 (3-1-17)
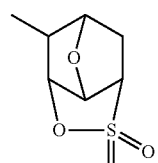 (3-1-18)
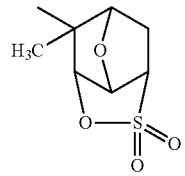 (3-1-19)
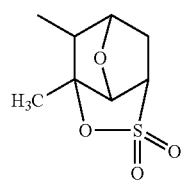 (3-1-20)
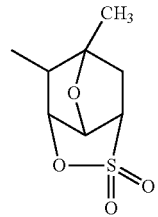 (3-1-21)
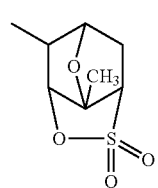 (3-1-22)

(3-1-23) 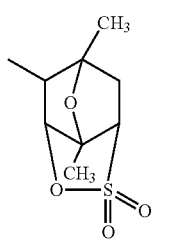
(3-1-24) 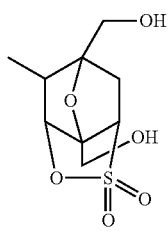
(3-1-25) 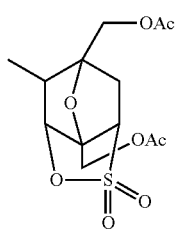
(3-1-26) 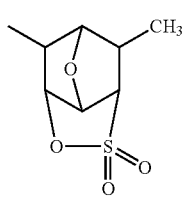
(3-1-27) 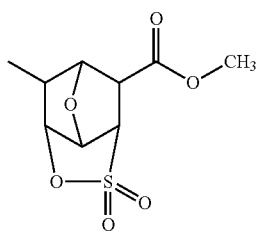
(3-1-28) 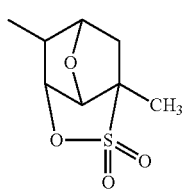
(3-1-29) 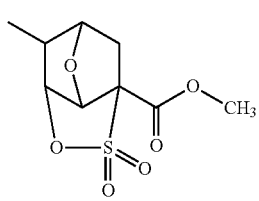
(3-1-30) 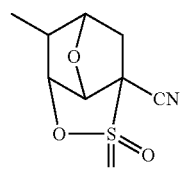
(3-1-31) 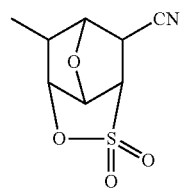
(3-1-32) 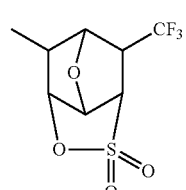
(3-1-33) 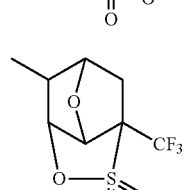
(3-2-1) 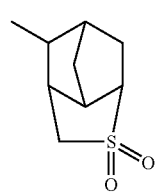
(3-2-2) 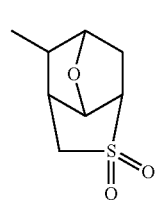
(3-3-1) 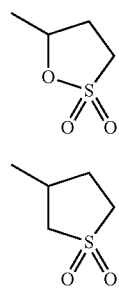
(3-4-1)
As the cyclic group containing —$SO_2$—, among the above, the group represented by the formula (3-1) is preferable, at least one selected from the group consisting of the group represented by any one of the chemical formulas (3-1-1), (3-1-18), (3-3-1), and (3-4-1) is preferable, and the group represented by the chemical formula (3-1-1) is the most preferable.

"A cyclic group containing lactone" indicates a cyclic group containing a ring (lactone ring) that includes —O—C(=O)— in its ring skeleton. If the lactone ring is counted as a first ring and when the group has only one ring, the group is referred to as a monocyclic group, and when the group has another ring structure, the group is referred to as a polycyclic group regardless of its structure. The cyclic group containing lactone may be monocyclic or polycyclic.

The cyclic group containing lactone in the structural unit (b-3) is not particularly limited, and an arbitrary group can be used. Specifically, the examples of the monocyclic group containing lactone include groups in which one hydrogen atom is removed from 4 to 6-membered ring lactones such as a group in which one hydrogen atom is removed from β-propionolactone, a group in which one hydrogen atom is removed from γ-butyrolactone, and a group in which one hydrogen atom is removed from δ-valerolactone. In addition, the examples of the polycyclic group containing lactone include groups in which one hydrogen atom is removed from bicycloalkane, tricycloalkane, and tetracycloalkane which have a lactone ring.

The structural unit (b-3) is not particularly limited, if the unit has the cyclic group containing —SO$_2$— or the cyclic group containing lactone, and at least one structural unit selected from group consisting of a structural unit (b-3-S) derived from acrylic ester in which a hydrogen atom bonded to a carbon atom in a position is substituted with a substituent and including the cyclic group containing —SO$_2$—, and a structural unit (b-3-L) derived from acrylic ester in which a hydrogen atom bonded to a carbon atom in a position is substituted with a substituent and including the cyclic group containing lactone is preferable.

Structural Unit (b-3-S)

More specifically, the examples of the structural unit (b-3-S) include a structural unit represented by the following formula (b-S1).

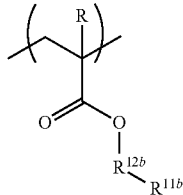

(b-S1)

(In the formula, R is a hydrogen atom, an alkyl group having 1 to 5 carbon atom, or a halogenated alkyl group having 1 to 5 carbon atoms, $R^{11b}$ is a cyclic group containing —SO$_2$—, and $R^{12b}$ is single bond or a divalent linking group.)

In the formula (b-S1), R is the same as described above.

$R^{11b}$ is the same as the cyclic group containing —SO$_2$- exemplified above.

$R^{12b}$ may be either of single bond or a divalent linking group. The divalent linking group is preferable in view of exhibiting excellent effect of the present invention.

The divalent linking group in $R^{12b}$ is not particularly limited, and the preferable examples thereof include a divalent hydrocarbon group which may have a substituent and a divalent linking group including a hetero atom.

Divalent Hydrocarbon Group which May have a Substituent

A hydrocarbon group as the divalent linking group may be an aliphatic hydrocarbon group or an aromatic hydrocarbon group. The aliphatic hydrocarbon group means a hydrocarbon group not having an aromatic property. The aliphatic hydrocarbon group may be saturated or unsaturated. Commonly, a saturated hydrocarbon group is preferable. More specifically, the examples of the aliphatic hydrocarbon group include a linear or branched-chain aliphatic hydrocarbon group and an aliphatic hydrocarbon group including a ring in the structure.

The number of carbon atoms of the linear or branched-chain aliphatic hydrocarbon group is preferably 1 to 10, more preferably 1 to 8, and still more preferably 1 to 5.

A linear alkylene group is preferable as the linear aliphatic hydrocarbon group. Specifically, the examples thereof include a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—].

A branched-chain alkylene group is preferable as the branched-chain aliphatic hydrocarbon group. Specifically, the examples thereof include alkylalkylene groups, for example, an alkylmethylene group such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; an alkylethylene group such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; an alkyltrimethylene group such as —CH(CH$_3$)CH$_2$CH$_2$— and —CH$_2$CH(CH$_3$)CH$_2$—; and an alkyltetramethylene group such as —CH(CH$_3$)CH$_2$CH$_2$CH$_2$— and —CH$_2$CH(CH$_3$)CH$_2$CH$_2$—. As the alkyl group in the alkylalkylene groups, a linear alkyl group having 1 to 5 carbon atoms is preferable.

The linear or branched-chain aliphatic hydrocarbon group may have a substituent substituting a hydrogen atom (a group or an atom other than a hydrogen atom) or may not. Examples of the substituent include a fluorine atom, a fluorinated alkyl group having 1 to 5 carbon atoms and substituted with a fluorine atom, and an oxo group (=O).

Examples of the aliphatic hydrocarbon group including a ring in the structure include a cyclic aliphatic hydrocarbon group which may include a substituent including a hetero atom in the structure (a group in which two hydrogen atoms are removed from an aliphatic hydrocarbon ring), a group in which the cyclic aliphatic hydrocarbon group is bonded to the terminal of the linear or branched-chain aliphatic hydrocarbon group, and a group in which the cyclic aliphatic hydrocarbon group is interposed in the middle of the linear or branched-chain aliphatic hydrocarbon group. Examples of the linear or branched-chain aliphatic hydrocarbon group include the same groups as described above.

The number of carbon atoms of the cyclic aliphatic hydrocarbon group is preferably 3 to 20 and more preferably 3 to 12.

The cyclic aliphatic hydrocarbon group may be polycyclic or monocyclic. Examples of the monocyclic aliphatic hydrocarbon group include groups in which two hydrogen atoms are removed from monocycloalkane. The number of carbon atoms of the monocycloalkane is preferably 3 to 6. Specifically, the examples thereof include cyclopentane and cyclohexane. As the polycyclic aliphatic hydrocarbon group, a group in which two hydrogen atoms are removed from polycycloalkane is preferable. The number of carbon atoms of the polycycloalkane is preferably 7 to 12. Specifically, the examples thereof include adamantane, norbornane, isobornane, tricyclodecane, and tetracyclododecane.

The cyclic aliphatic hydrocarbon group may have a substituent substituting a hydrogen atom (a group or an atom other than a hydrogen atom) or may not. Examples of the substituent include an alkyl group, an alkoxy group, a halogen atom, a halogenated alkyl group, a hydroxyl group, and an oxo group (=O).

An alkyl group having 1 to 5 carbon atoms is preferable as the substituent. A methyl group, an ethyl group, a propyl group, an n-butyl group, and a tert-butyl group are more preferable.

An alkoxy group having 1 to 5 carbon atoms is preferable as the substituent, a methoxy group, an ethoxy group, an n-propoxy group, an iso-propoxy group, an n-butoxy group, and a tert-butoxy group are more preferable, and a methoxy group and an ethoxy group are particularly preferable.

Examples of the halogen group as the substituent include a fluorine atom, a chlorine atom, a bromine atom, and an iodine atom, and a fluorine atom is preferable.

Examples of the halogenated alkyl group as the substituent include a group in which hydrogen atom(s) of an alkyl group is partially or entirely substituted with the halogen atom.

A carbon atom constituting a ring structure of the cyclic aliphatic hydrocarbon group may be partially substituted with —O— or —S—. As the substituent including the hetero atom, —O—, —C(=O)—O—, —S—, —S(=O)$_2$—, and —S(=O)$_2$—O— are preferable.

An aromatic hydrocarbon group of the divalent hydrocarbon group is a divalent hydrocarbon group having at least one aromatic ring, and may have a substituent. The aromatic ring is not particularly limited, if the ring is a cyclic conjugated ring having π electron in the number of 4n+2, and the ring may be monocyclic or polycyclic. The number of carbon atoms of the aromatic ring is preferably 5 to 30, more preferably 5 to 20, still more preferably 6 to 15, and particularly preferably 6 to 12. However, the number of the carbon atoms does not include the number of the substituent.

Specifically, the examples of the aromatic ring include an aromatic hycrocarbon ring such as benzene, naphthalene, anthracene, and phenanthrene; and an aromatic heterocyclic ring of which a carbon atom constituting the aromatic hycrocarbon ring is partially substituted with a hetero atom. Examples of the hetero atom in the aromatic heterocyclic ring include an oxygen atom, a sulfur atom, and a nitrogen atom. Specifically, the examples of the aromatic heterocyclic ring include a pyridine ring and a thiophene ring.

Specifically, the examples of the aromatic hydrocarbon group as the divalent hydrocarbon group include a group in which two hydrogen atoms are removed from the aromatic hycrocarbon ring or the aromatic heterocyclic ring (an arylene group or a heteroarylene group); a group in which two hydrogen atoms are removed from an aromatic compound including two or more aromatic rings (for example, biphenyl, fluorine, and the like); and a group in which one hydrogen atom of the group in which one hydrogen atom is removed from the aromatic hydrocarbon ring or the aromatic heterocyclic ring (an aryl group or a heteroaryl group) is substituted with an alkylene group (for example, a group in which one hydrogen atom is further removed from an aryl group in an arylalkyl group, such as a benzyl group, a phenethyl group, a 1-a naphthylmethyl group, a 2-naphthylmethyl group, a 1-naphthylethyl group, and a 2-naphthylethyl group).

The number of carbon atoms of the alkylene group bonded to an aryl group or a heteroaryl group is preferably 1 to 4, more preferably 1 to 2, and particularly preferably 1.

A hydrogen atom included in the aromatic hydrocarbon group may be substituted with a substituent. For example, a hydrogen atom bonded to an aromatic ring in the aromatic hydrocarbon group may be substituted with a substituent. Examples of the substituent include an alkyl group, an alkoxy group, a halogen atom, a halogenated alkyl group, a hydroxyl group, and an oxo group (=O).

An alkyl group having 1 to 5 carbon atoms is preferable as the substituent, and a methyl group, an ethyl group, an n-propyl group, an n-butyl group, and a tert-butyl group are more preferable.

An alkoxy group having 1 to 5 carbon atoms is preferable as the substituent, a methoxy group, an ethoxy group, an n-propoxy group, an iso-propoxy group, an n-butoxy group, and a tert-butoxy group are preferable, and a methoxy group and an ethoxy group are more preferable.

Examples of the halogen atom as the substituent include a fluorine atom, a chlorine atom, a bromine atom, and an iodine atom, and a fluorine atom is preferable.

Examples of the halogenated alkyl group as the substituent include a group in which hydrogen atom(s) of an alkyl group is partially or entirely substituted with the halogen atom.

Divalent Linking Group Including a Hetero Atom

A hetero atom in the divalent linking group including a hetero atom is an atom other than a carbon atom and a hydrogen atom, and the examples thereof include an oxygen atom, a nitrogen atom, a sulfur atom, and a halogen atom.

Specifically, the examples of the divalent linking group including a hetero atom include a nonhydrocarbon linking group such as —O—, —C(=O)—, —C(=O)—O—, —O—C(=O)—O—, —S—, —S(=O)$_2$—, —S(=O)$_2$—O—, —NH—, —NH—C(=O)—, —NH—C(=NH)—, and =N—, and a combination of at least one of the nonhydrocarbon linking group and a divalent hydrocarbon group. Examples of the divalent hydrocarbon group include the same divalent hydrocarbon group as described above, which may have a substituent, and a linear or branched-chain aliphatic hydrocarbon group is preferable.

Among the above, —NH— in —C(=O)—NH—, H in —NH— and —NH—C(=NH)—, respectively, may be substituted with a substituent such as an alkyl group and an acyl group. The number of carbon atoms of the substituent is preferably 1 to 10, more preferably 1 to 8, and particularly preferably 1 to 5.

As the divalent linking group in $R^{12b}$, a linear or branched-chain alkylene group, a cyclic aliphatic hydrocarbon group, and a divalent linking group including a hetero atom are particularly preferable.

When the divalent linking group in $R^{12b}$ is a linear or branched-chain alkylene group, the number of carbon atoms of the alkylene group is preferably 1 to 10, more preferably 1 to 6, particularly preferably 1 to 4, and the most preferably 1 to 3. Specifically, the examples of the "divalent hydrocarbon group which may have a substituent" as the divalent linking group described above include the same linear alkylene group and branched-chain alkylene group, which are exemplified as the linear or branched-chain aliphatic hydrocarbon group.

When the divalent linking group in $R^{12b}$ is a cyclic aliphatic hydrocarbon group, the examples of the cyclic aliphatic hydrocarbon group include the same group as the cyclic aliphatic hydrocarbon group exemplified as the "aliphatic hydrocarbon group including a ring in the structure" in the description of the "divalent hydrocarbon group which may have a substituent" as the divalent linking group.

As the cyclic aliphatic hydrocarbon group, cyclopentane, cyclohexane, norbornane, isobornane, adamantane, tricyclodecane, or a group in which two or more hydrogen atoms are removed from tetracyclododecane is particularly preferable.

When the divalent linking group in $R^{12b}$ is a divalent linking group including a hetero atom, the preferable examples of the linking group include —O—, —C(=O)—O—, —C(=O)—, —O—C(=O)—O—, —C(=O)—NH—, —NH— (H may be substituted with a substituent such as an alkyl group and an acyl group), —S—, —S(=O)$_2$—, —S(=O)$_2$—O—, and a group represented by General formula —Y$^1$—O—Y$^2$—, —[Y$^1$—C(=O)—O]$_{m'}$—Y$^2$—, or —Y$^1$—O—C(=O)—Y$_2$— [in the formulas, Y$^1$ and Y$^2$ each independently are a divalent hydrocarbon group which may have a substituent, 0 is an oxygen atom, and m' is an integer of 0 to 3].

When the divalent linking group in $R^{12b}$ is —NH—, a hydrogen atom in —NH— may be substituted with a substituent such as an alkyl group and an acyl group. The number of carbon atoms of the substituent (an alkyl group, a acyl group, and the like) is preferably 1 to 10, more preferably 1 to 8, and particularly preferably 1 to 5.

In the formula —Y$^1$—O—Y$^2$—, —[Y$^1$—C(=O)—O]$_{m'}$—Y$^2$—, or —Y$^1$—O—C(=O)—Y$^2$—, Y$^1$ and Y$^2$ each independently are a divalent hydrocarbon group which may have a substituent. Examples of the divalent hydrocarbon group include the same "divalent hydrocarbon group which may have a substituent", which is exemplified as the divalent linking group.

As the Y$^1$, a linear aliphatic hydrocarbon group is preferable, a linear alkylene group is more preferable, an alkylene group having 1 to 5 carbon atoms is more preferable, and a methylene group and an ethylene group are particularly preferable.

As the Y$^2$, a linear or branched-chain aliphatic hydrocarbon group is preferable, and a methylene group, an ethylene group, and an alkylmethylene group are more preferable. As an alkyl group in the alkylmethylene group, a linear alkyl group having 1 to 5 carbon atoms is preferable, a linear alkyl group having 1 to 3 carbon atoms is more preferable, and a methyl group is particularly preferable.

In the group represented by formula —[Y$^1$—C(=O)—O]$_{m'}$—Y$^2$—, m' is an integer of 0 to 3, an integer of 0 to 2 is preferable, 0 or 1 is more preferable, and 1 is particularly preferable. That is, as the group represented by formula —[Y$^1$—C(=O)—O]$_{m'}$—Y$^2$—, a group represented by formula —Y$^1$—C(=O)—O—Y$^2$— is particularly preferable. Among these, a group represented by formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and the most preferably 1. b' is an integer of 1 to 10, preferably an integer of 1 to 8, more preferably an integer of 1 to 5, still more preferably 1 or 2, and the most preferably 1.

In the divalent linking group in $R^{12b}$, as the divalent linking group including a hetero atom, an organic group composed of a combination of at least one nonhydrocarbon group and a divalent hydrocarbon group is preferable. Among these, a linear group having an oxygen atom as a hetero atom such as a group including ether bond or ester bond is preferable, a group represented by the formula —Y$^1$—O—Y$^2$—, —[Y$^1$—C(=O)—O]$_{m'}$—Y$^2$—, or —Y$^1$—O—C(=O)—Y$^2$— is more preferable, and a group represented by the formula —[Y$^1$—C(=O)—O]$_{m'}$—Y$^2$— or —Y$^1$—O—C(=O)—Y$^2$— is particularly preferable.

As the divalent linking group in $R^{12b}$, a group including an alkylene group or ester bond (—C(=O)—O—) is preferable.

A linear or branched-chain alkylene group is preferable as the alkylene group. Preferable examples of the linear aliphatic hydrocarbon group include a methylene group [—CH$_2$—], an ethylene group [—(CH$_2$)$_2$—], a trimethylene group [—(CH$_2$)$_3$—], a tetramethylene group [—(CH$_2$)$_4$—], and a pentamethylene group [—(CH$_2$)$_5$—]. Preferable examples of the branched-chain alkylene group include an alkylalkylene group, for example, an alkylmethylene group such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; an alkylethylene group such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; an alkyltrimethylene group such as —CH(CH$_3$)CH$_2$CH$_2$— and —CH$_2$CH(CH$_3$)CH$_2$—; an alkyltetramethylene group such as —CH(CH$_3$)CH$_2$CH$_2$CH$_2$— and —CH$_2$CH(CH$_3$)CH$_2$CH$_2$—.

As the divalent linking group including ester bond, a group represented by formula: —R$^{13b}$—C(=O)—O— [in the formula, R$^{13b}$ is a divalent linking group] is particularly preferable. That is, a structural unit represented by the following formula (b-S1-1) is preferable as a structural unit (b-3-S).

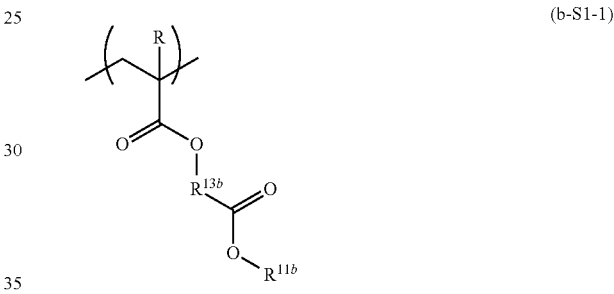

(b-S1-1)

(In the formula, R and R$^{11b}$ are respectively the same as described above, and R$^{13b}$ is a divalent linking group.)

R$^{13b}$ is not particularly limited, and the examples thereof include the same group as the divalent linking group in R$^{12b}$.

As the divalent linking group of R$^{13b}$, a linear or branched-chain alkylene group, an aliphatic hydrocarbon group including a ring in the structure, or a divalent linking group including a hetero atom is preferable, a linear or branched-chain alkylene group or a divalent linking group including an oxygen atom as a hetero atom is preferable.

As the linear alkylene group, a methylene group or an ethylene group is preferable, and a methylene group is particularly preferable. As the branched-chain alkylene group, an alkylmethylene group or an alkylethylene group is preferable, and —CH(CH$_3$)—, —C(CH$_3$)$_2$—, or —C(CH$_3$)$_2$CH$_2$— is particularly preferable.

As the divalent linking group including an oxygen atom, a divalent linking group including ether bond or ester bond is preferable, and —Y$^1$—O—Y$^2$—, —[Y$^1$—C(=O)—O]$_{m'}$—Y$^2$—, or —Y$^1$—O—C(=O)—Y$^2$— described above is more preferable. Y$^1$ and Y$^2$ each independently are a divalent hydrocarbon group which may have a substituent, and m' is an integer of 0 to 3. Among these, —Y$^1$—O—C(=O)—Y$^2$— is preferable, and a group represented by —(CH$_2$)$_c$—O—C(=O)—(CH$_2$)$_d$— is particularly preferable. c is an integer of 1 to 5, and preferably 1 or 2. d is an integer of 1 to 5, and preferably 1 or 2.

As the structural unit (b-3-S), in particular, a structural unit represented by the following formula (b-S1-11) or (b-S1-12) is preferable, and a structural unit represented by formula (b-S1-12) is more preferable.

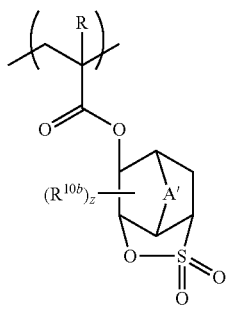
(b-S1-11)

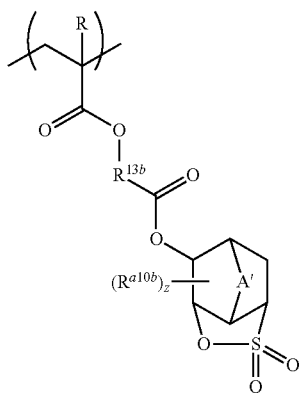
(b-S1-12)

(In the formulas, R, A', $R^{10b}$, z, and $R^{13b}$ are respectively the same as described above.)

In the formula (b-S1-11), A' is preferably a methylene group, an oxygen atom (—O—), or a sulfur atom (—S—).

$R^{13b}$ is preferably a linear or branched-chain alkylene group or a divalent linking group including an oxygen atom. Examples of the linear or branched-chain alkylene group in $R^{13b}$ and the divalent linking group including an oxygen atom include, respectively, the same linear or branched-chain alkylene group and the divalent linking group including an oxygen atom described above.

As the structural unit represented by (b-S1-12), in particular, a structural unit represented by the following formula (b-S1-12a) or (b-S1-12b) is preferable.

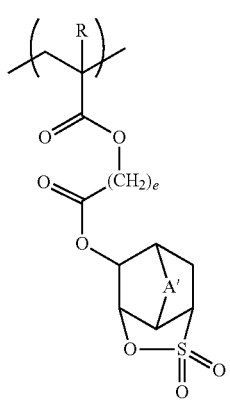
(b-S1-12a)

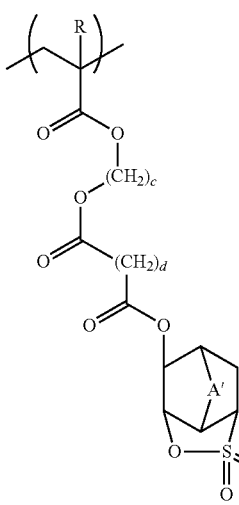
(b-S1-12b)

(In the formula, R and A' are respectively the same as described above, and c to e each independently are an integer of 1 to 3.)

Structural Unit (b-3-L)

Examples of the structural unit (b-3-L) include a structural unit in which $R^{11b}$ in the formula (b-S1) is substituted with a cyclic group containing lactone, and more specifically, include structural units represented by the following formulas (b-L1) to (b-L5).

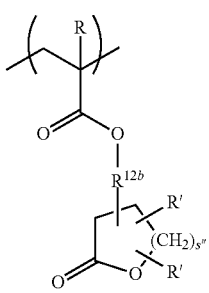
(b-L1)

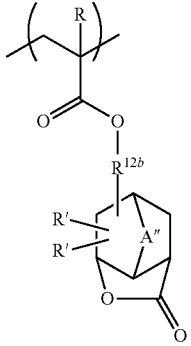
(b-L2)

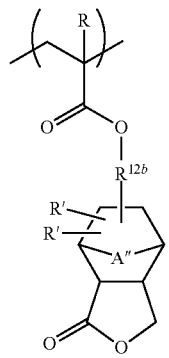
(b-L3)

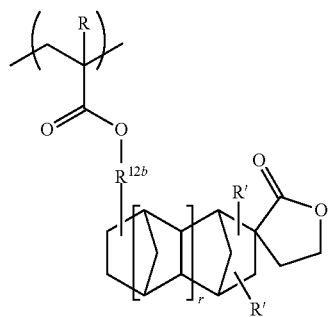
(b-L4)

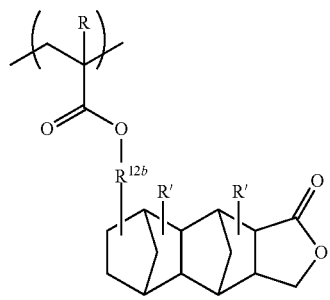
(b-L5)

(In the formula, R is a hydrogen atom, an alkyl group having 1 to 5 carbon atoms, or a halogenated alkyl group having 1 to 5 carbon atoms; R' each independently is a hydrogen atom, an alkyl group, an alkoxy group, a halogenated alkyl group, a hydroxyl group, —COOR'', —OC(=O)R'', a hydroxyalkyl group, or a cyano group, R'' is a hydrogen atom or an alkyl group; $R^{12b}$ is single bond or a divalent linking group, s'' is an integer of 0 to 2; A'' is an alkylene group having 1 to 5 carbon atoms, which may include an oxygen atom or a sulfur atom, an oxygen atom, or a sulfur atom; and r is 0 or R in the formulas (b-L1) to (b-L5) is the same as described above.

As an alkyl group, an alkoxy group, a halogenated alkyl group, —COOR'', —OC(=O)R'', and a hydroxyalkyl group in R' respectively, the above-mentioned same groups as the alkyl group, the alkoxy group, the halogenated alkyl group, —COOR'', —OC(=O)R'', and the hydroxyalkyl group, which are exemplified as the substituent and may be included in the cyclic group containing —SO$_2$—, can be exemplified.

R' is preferably a hydrogen atom in consideration of easy industrial availability.

An alkyl group in R'' may be any one of a linear, branched-chain, or cyclic group.

When R'' is a linear or branched-chain alkyl group, the number of carbon atoms is preferably 1 to 10, and still more preferably 1 to 5.

When R'' is a cyclic alkyl group, the number of carbon atoms is preferably 3 to 15, still more preferably 4 to 12, and the most preferably 5 to 10. Specifically, the examples thereof include a group in which at least one hydrogen atom is removed from polycycloalkane such as monocycloalkane, bicycloalkane, tricycloalkane, and tetracycloalkane which may be substituted with a fluorine atom or a fluorinated alkyl group or may not. Specifically, the examples thereof include a group in which at least one hydrogen atom is removed from monocycloalkane such as cyclopentane and cyclohexane, or polycycloalkane such as adamantane, norbornane, isobornane, tricyclodecane, and tetracyclododecane.

Examples of the A'' include the same group as A' in the formula (3-1). A'' is preferably an alkylene group having 1 to 5 carbon atoms, an oxygen atom (—O—), or a sulfur atom (—S—), and more preferably an alkylene group having 1 to 5 carbon atoms or —O—. As the alkylene group having 1 to 5 carbon atoms, a methylene group or a dimethylmethylene group is more preferable, and a methylene group is the most preferable.

$R^{12b}$ is the same as $R^{12b}$ in the formula (b-S1).

In the formula (b-L1), s'' is preferably 1 to 2.

Hereinafter, specific examples of structural units represented by the formulas (b-L1) to (b-L3) will be described. In the following respective formulas, $R^\alpha$ is a hydrogen atom, a methyl group, or a trifluoromethyl group.

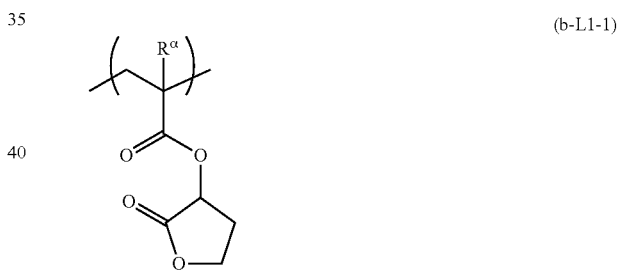
(b-L1-1)

(b-L1-2)

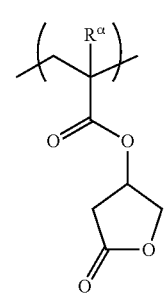

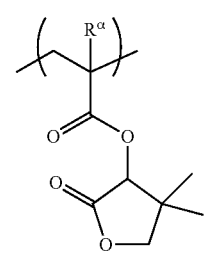
(b-L1-3)

(b-L1-4) 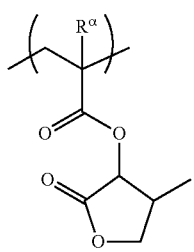
(b-L1-5) 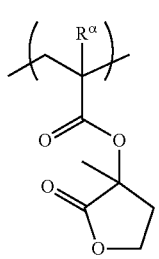
(b-L1-6) 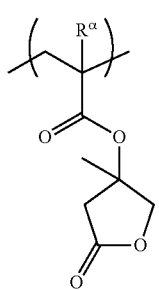
(b-L1-7) 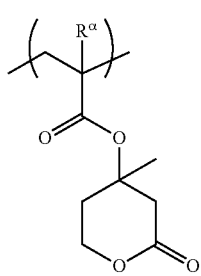
(b-L1-8) 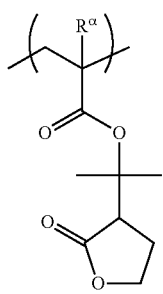
(b-L1-9) 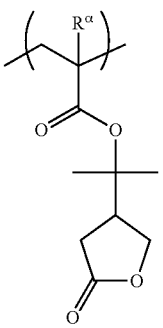
(b-1-L10) 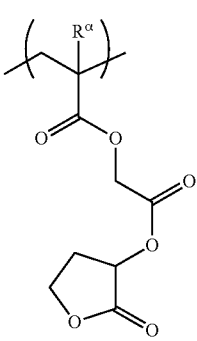
(b-L1-11) 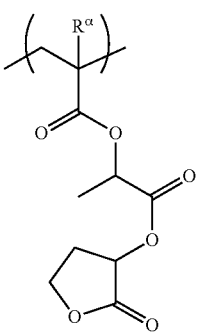
(b-L1-12) 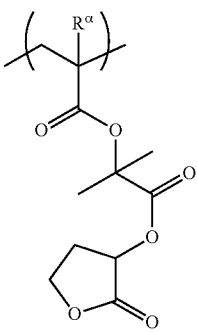

(b-L1-13)
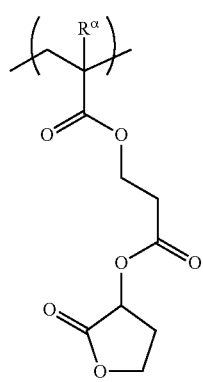
(b-L2-1)
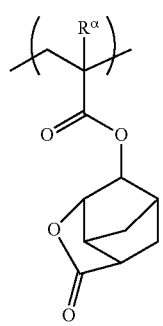
(b-L2-2)
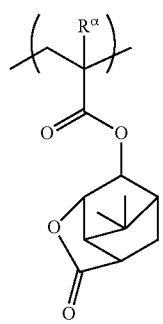
(b-L2-3)
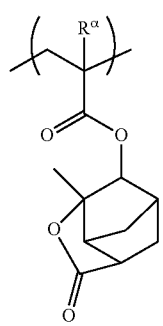
(b-L2-4)
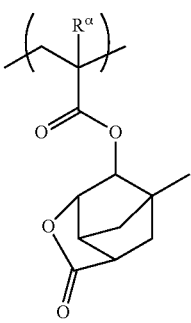
(b-L2-5)
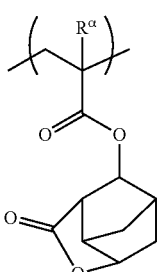
(b-L2-6)
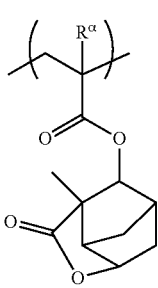
(b-L2-7)
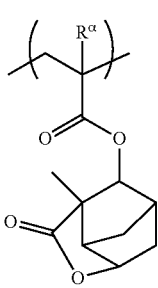
(b-L2-8)
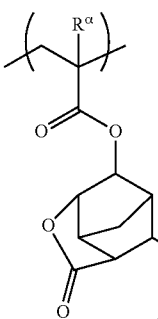

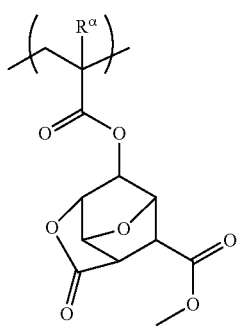
(b-L2-9)
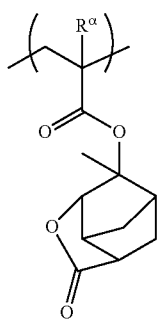
(b-L2-10)
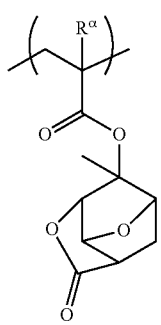
(b-L2-11)
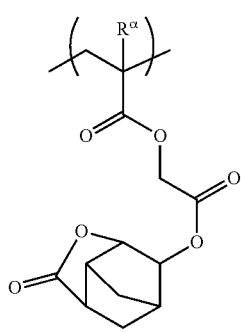
(b-L2-12)
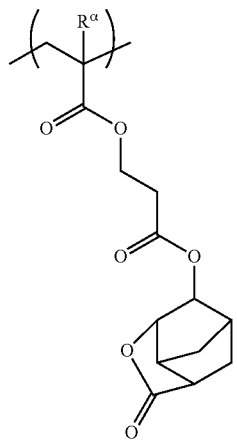
(b-L2-13)
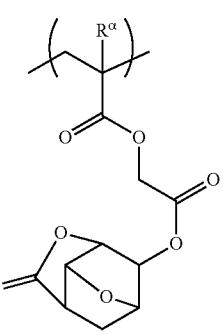
(b-L2-14)
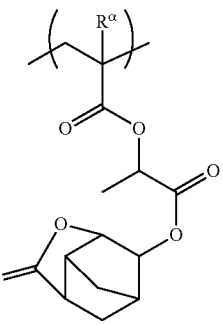
(b-L2-15)
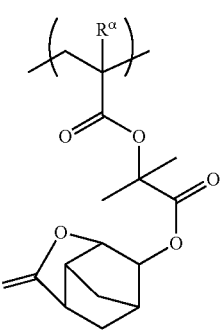
(b-L2-16)

(b-L2-17)

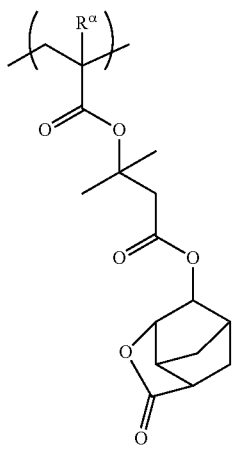

(b-L3-1)

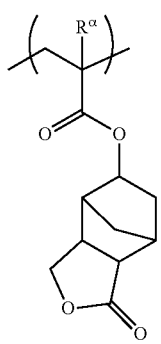

(b-L3-2)

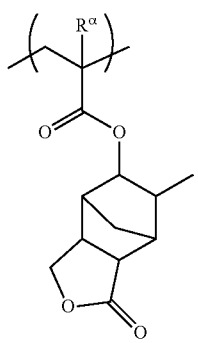

(b-L3-3)

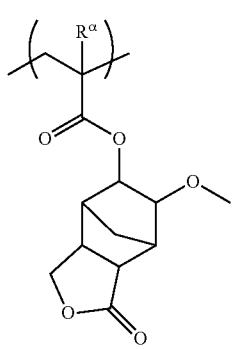

(b-L3-4)

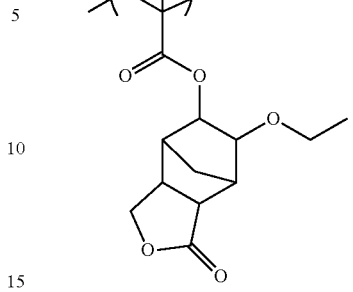

(b-L3-5)

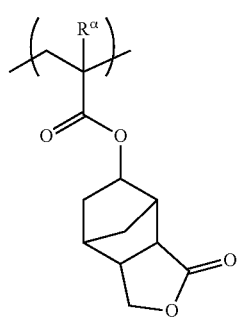

As the structural unit (b-3-L), at least one selected from the group consisting of structural units represented by the formulas (b-L1) to (b-L5) is preferable, at least one selected from the group consisting of structural units represented by the formulas (b-L1) to (b-L3) is more preferable, and at least one selected from the group consisting of structural units represented by the formula (b-L1) or (b-L3) is particularly preferable.

Among these, at least one selected from the group consisting of structural units represented by the formulas (b-L1-1), (b-L1-2), (b-L2-1), (b-L2-7), (b-L2-12), (b-L2-14), (b-L3-1), and (b-L3-5) is preferable.

In addition, as the structural unit (b-3-L), structural units represented by the following formulas (b-L6) and (b-L7) are also preferable.

(b-L6)

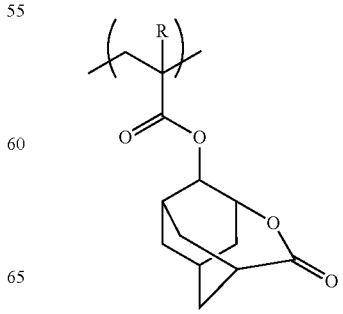

(b-L7)

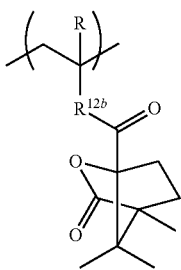

In the formulas (b-L6) and (b-L7), R and $R^{12b}$ are the same as described above.

In addition, the (B-3) acrylic resin includes an acid-dissociative dissolution-controlling group, and structural units represented by the following formulas (b5) to (b7) as a structural unit which increases solubility of the (B-3) acrylic resin in alkali under the action of an acid.

(b5)

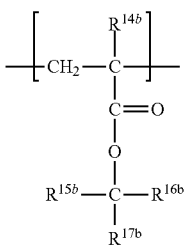

(b6)

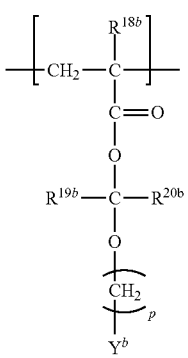

(b7)

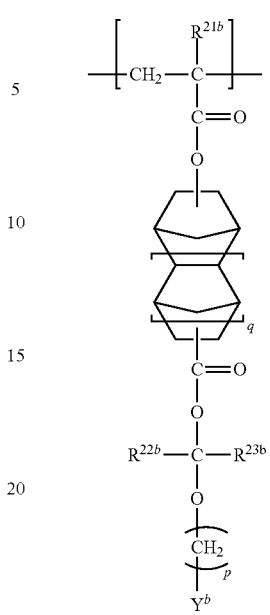

In the formulas (b5) to (b7), $R^{14b}$, and $R^{18b}$ to $R^{23b}$ each independently represent a hydrogen atom, a linear or branched alkyl group having 1 to 6 carbon atoms, a fluorine atom, or a linear or branched fluorinated alkyl group having 1 to 6 carbon atoms, $R^{15b}$ to $R^{17b}$ each independently represent a linear or branched alkyl group having 1 to 6 carbon atoms or a linear or branched fluorinated alkyl group having 1 to 6 carbon atoms, $R^{16b}$ and $R^{17b}$ may be bonded to each other to form a hycrocarbon ring having 5 to 20 carbon atoms together with carbon atoms to which $R^{16b}$ and $R^{17b}$ are bonded, $Y^b$ represents an alicyclic group or an alkyl group which may have a substituent, p represents an integer of 0 to 4, and q represents 0 or 1.

Examples of the linear or branched alkyl group include a methyl group, an ethyl group, a propyl group, an isopropyl group, an n-butyl group, an isobutyl group, a tert-butyl group, a pentyl group, an isopentyl group, and a neopentyl group. In addition, the fluorinated alkyl group is a group in which hydrogen atom(s) of an alkyl group is partially or entirely substituted with a fluorine atom.

When the $R^{16b}$ and $R^{17b}$ are bonded to each other but a hydrocarbon ring is not formed, the $R^{15b}$, $R^{16b}$, and $R^{17b}$ are preferably a linear or branched alkyl group having 2 to 4 carbon atoms in view of high contrast and excellent resolution and depth and width of focus. As the aforementioned $R^{19b}$, $R^{20b}$, $R^{22b}$, and $R^{23b}$, a hydrogen atom or a methyl group is preferable.

The $R^{16b}$ and $R^{17b}$ may form an alicyclic group having 5 to 20 carbon atoms together with carbon atoms to which $R^{16b}$ and $R^{17b}$ are bonded. Examples of the alicyclic group include a group in which at least one hydrogen atom is removed from monocycloalkane and polycycloalkane such as, bicycloalkane, tricycloalkane, and tetracycloalkane. Specifically, the examples thereof include a group in which at least one hydrogen atom is removed from monocycloalkane such as cyclopentane, cyclohexane, cycloheptane, and cyclooctane, or polycycloalkane such as adamantane, norbornane, isobornane, tricyclodecane, and tetracyclododecane. In particular, a group in which at least one hydrogen atom is removed from cyclohexane or adamantine (which may further have a substituent) is preferable.

Further, when the alicyclic group formed by $R^{16b}$ and $R^{17b}$ has a substituent on a ring skeleton, the examples of the substituent include a polar group such as a hydroxyl group, a carboxyl group, a cyano group, and an oxygen atom (=O), and a linear or branched alkyl group having 1 to 4 carbon atoms. The oxygen atom (=O) is particularly preferable as the polar group.

The $Y^b$ is an alicyclic group or an alkyl group, and the examples thereof include a group in which at least one hydrogen atom is removed from monocycloalkane and polycycloalkane such as bicycloalkane, tricycloalkane, and tetracycloalkane. Specifically, the examples thereof include a group in which at least one hydrogen atom is removed from monocycloalkane such as cyclopentane, cyclohexane, cycloheptane, and cyclooctane, and polycycloalkane such as adamantane, norbornane, isobornane, tricyclodecane, and tetracyclododecane. In particular, a group in which at least one hydrogen atom is removed from adamantane (which may further have a substituent) is preferable.

Further, when the alicyclic group of the $Y^b$ has a substituent on a ring skeleton, the examples of the substituent include a polar group such as a hydroxyl group, a carboxyl group, a cyano group, and an oxygen atom (=O), and a linear or branched alkyl group having 1 to 4 carbon atoms. The oxygen atom (=O) is particularly preferable as the polar group.

In addition, when $Y^b$ is an alkyl group, a linear or branched alkyl group having 1 to 20 carbon atoms is preferable, and a linear or branched alkyl group having 6 to 15 carbon atoms is more preferable. In particular, the alkyl group is preferably an alkoxyalkyl group, and the examples of the alkoxyalkyl group include a 1-methoxyethyl group, a 1-ethoxyethyl group, a 1-n-propoxyethyl group, a 1-isopropoxyethyl group, a 1-n-butoxyethyl group, a 1-isobutoxyethyl group, a 1-tert-butoxyethyl group, a 1-methoxypropyl group, a 1-ethoxypropyl group, a 1-methoxy-1-methylethyl group, and a 1-ethoxy-1-methylethyl group.

The specific preferable examples of the structural unit represented by the formula (b5) include structural units represented by the following formulas (b5-1) to (b5-33).

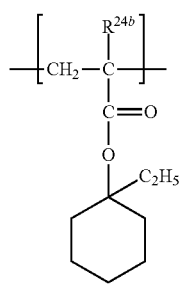

(b5-1)

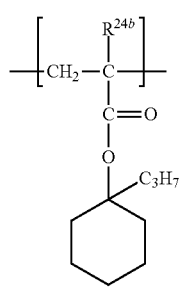

(b5-2)

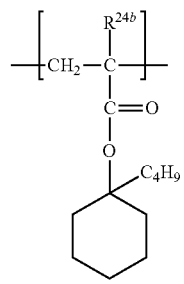

(b5-3)

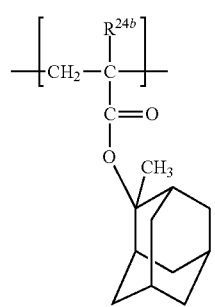

(b5-4)

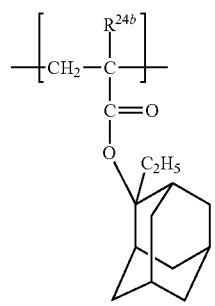

(b5-5)

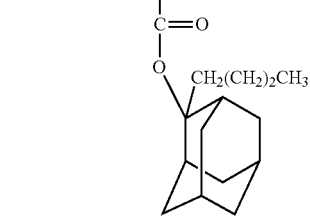

(b5-6)

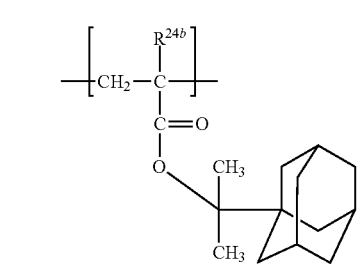

(b5-7)

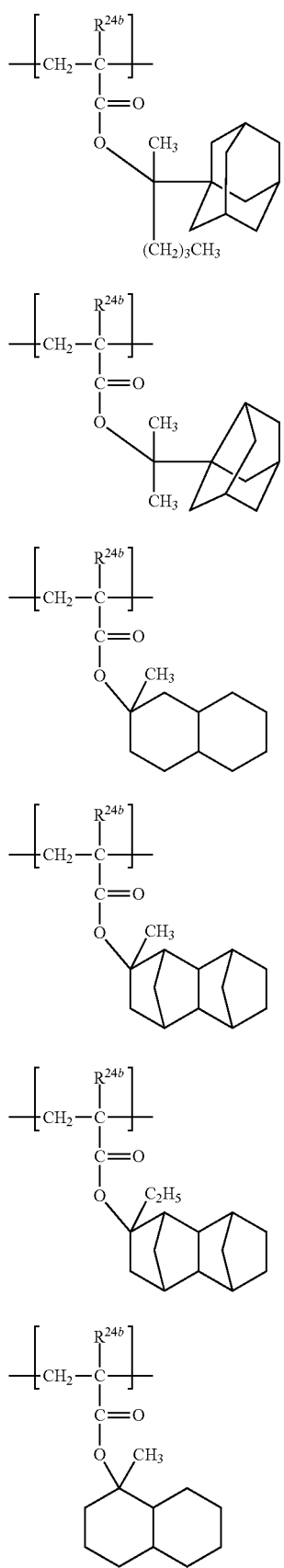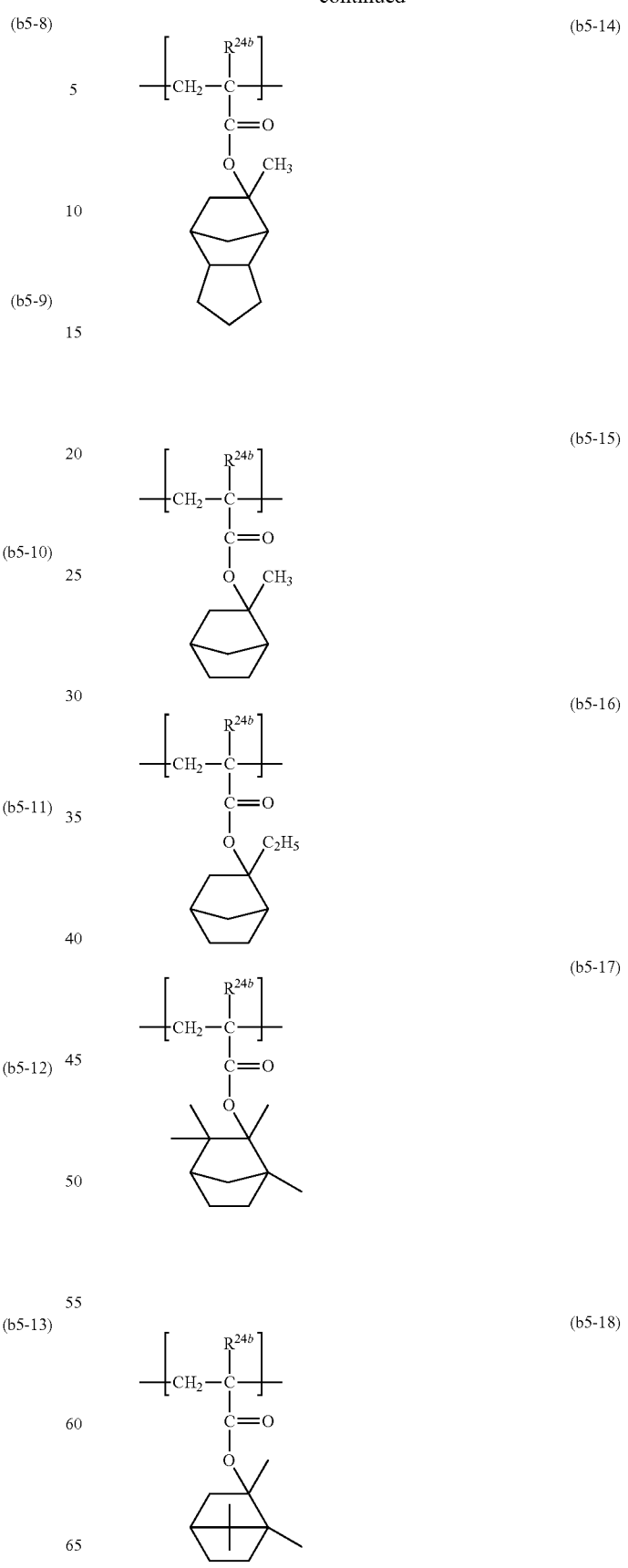

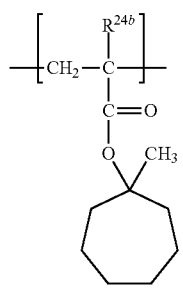 (b5-19)
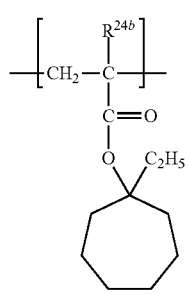 (b5-20)
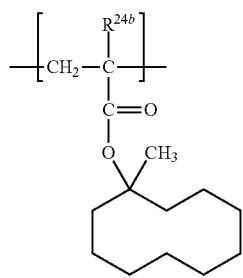 (b5-21)
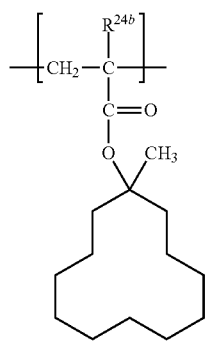 (b5-22)
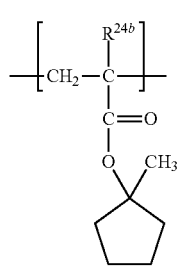 (b5-23)
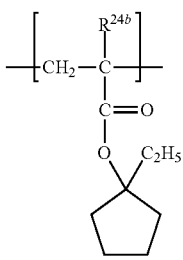 (b5-24)
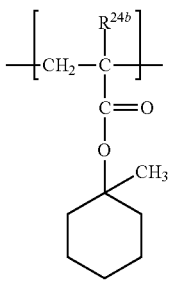 (b5-25)
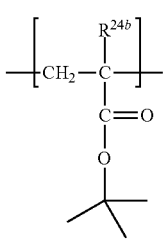 (b5-26)
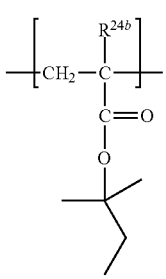 (b5-27)
(b5-28)
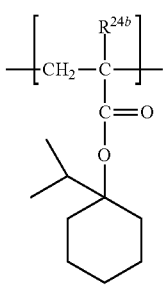 (b5-29)

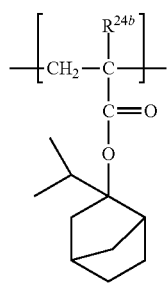 (b5-30)
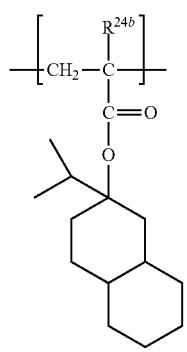 (b5-31)
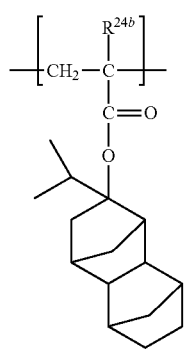 (b5-32)
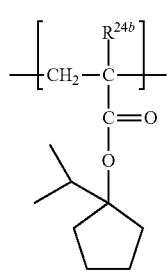 (b5-33)
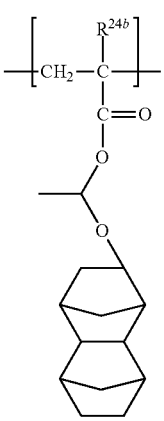 (b6-1)
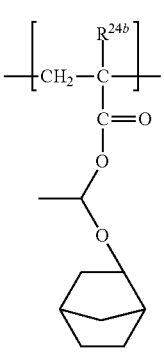 (b6-2)
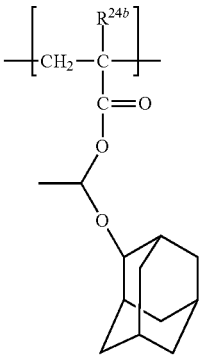 (b6-3)
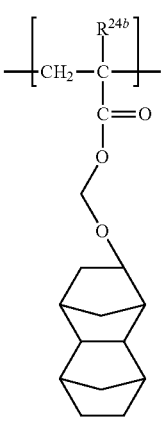 (b6-4)
In the formulas (b5-1) to (b5-33), $R^{24b}$ represents a hydrogen atom or a methyl group.
The specific preferable examples of the structural unit represented by the formula (b6) include structural units represented by the following formulas (b6-1) to (b6-25).

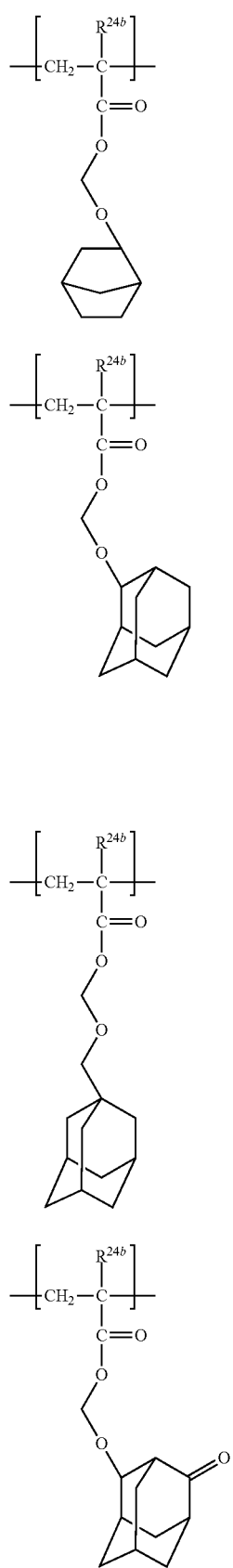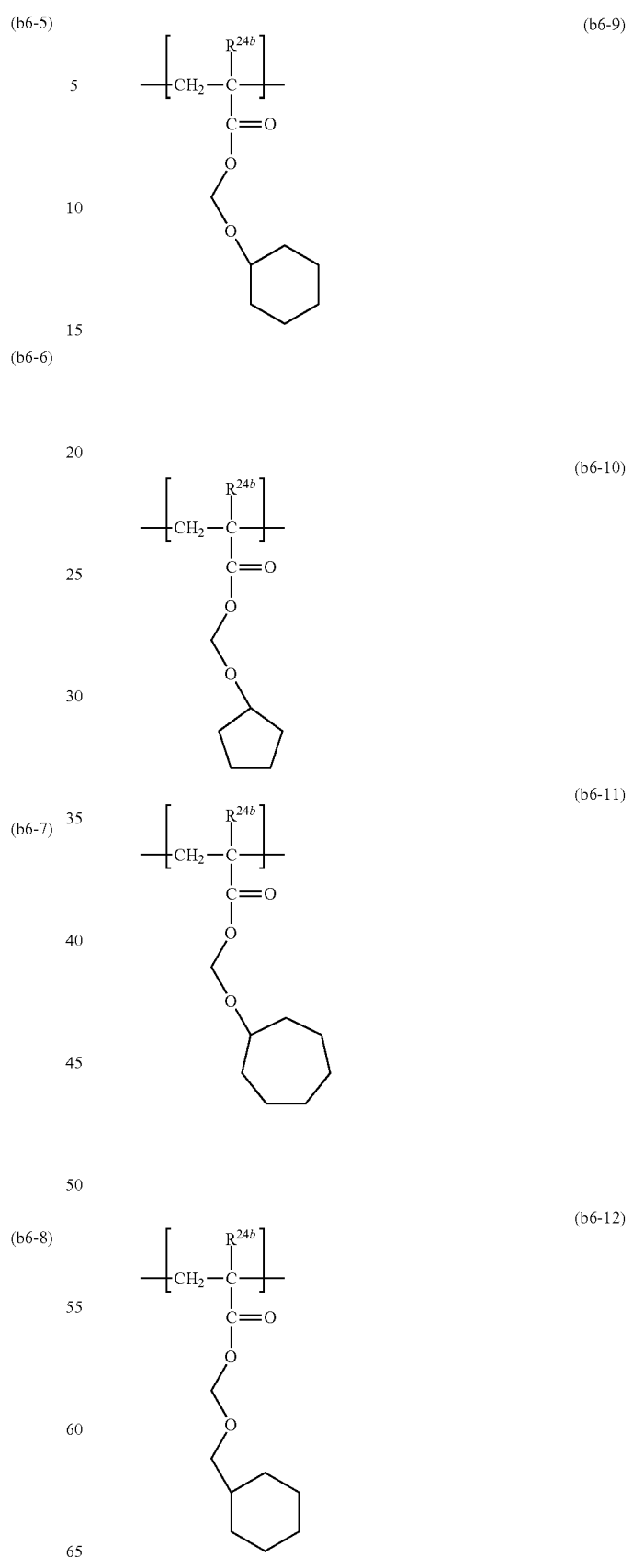

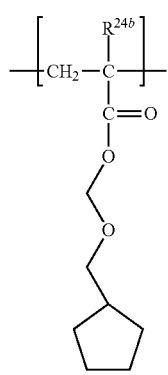 (b6-13)
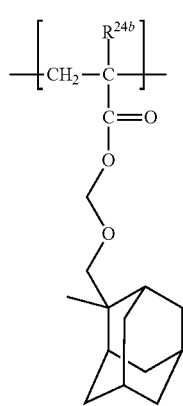 (b6-14)
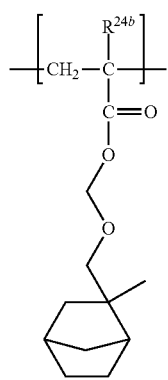 (b6-15)
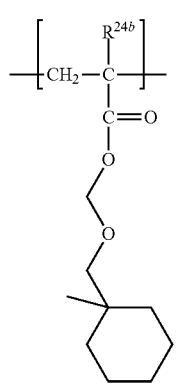 (b6-16)
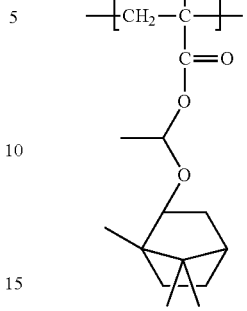 (b6-17)
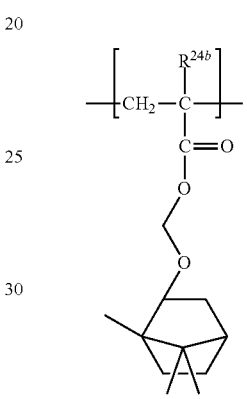 (b6-18)
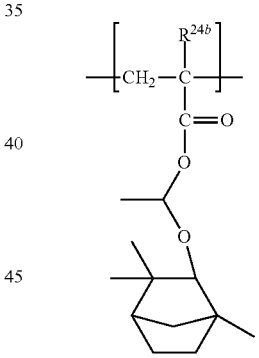 (b6-19)
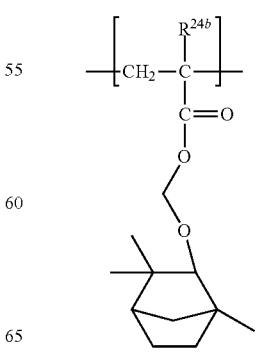 (b6-20)

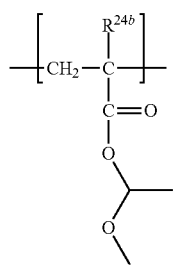 (b6-21)
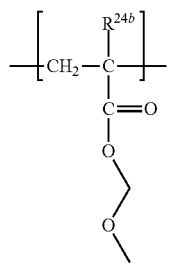 (b6-22)
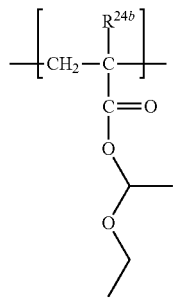 (b6-23)
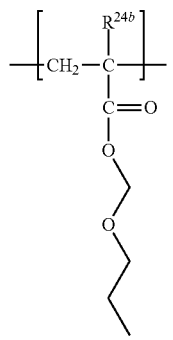 (b6-24)
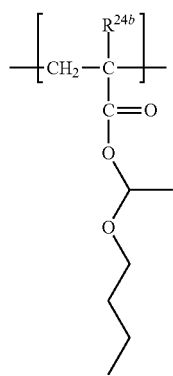 (b6-25)
In the formulas (b6-1) to (b6-25), $R^{24b}$ represents a hydrogen atom or a methyl group.
Preferable examples of the structural unit represented by the formula (b7) include structural units represented by the following formulas (b7-1) to (b7-15).
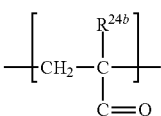
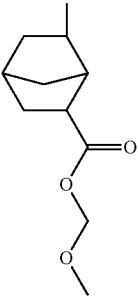
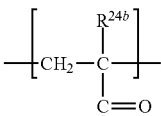 (b7-1)
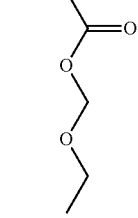
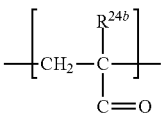 (b7-2)
 (b7-3)

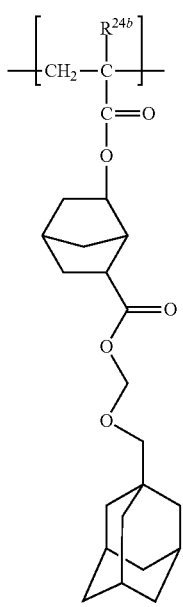
(b7-4)
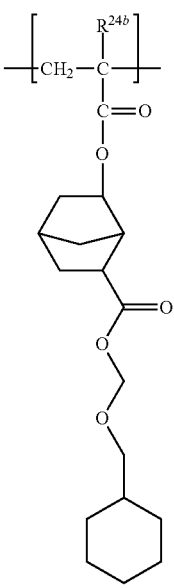
(b7-6)
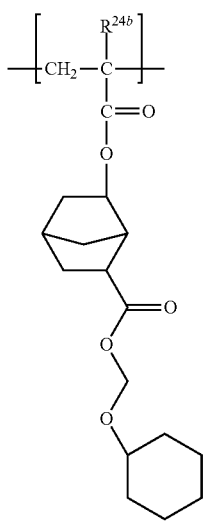
(b7-5)
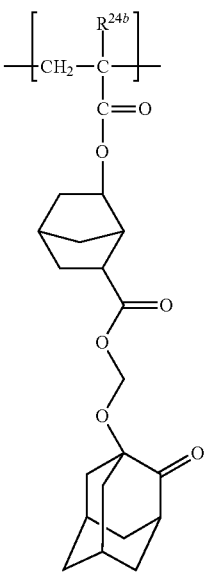
(b7-7)

(b7-8)
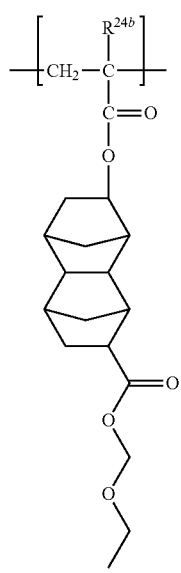
(b7-10)
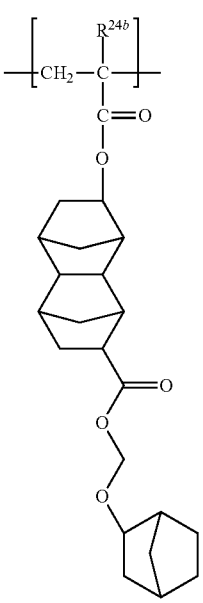
(b7-9)
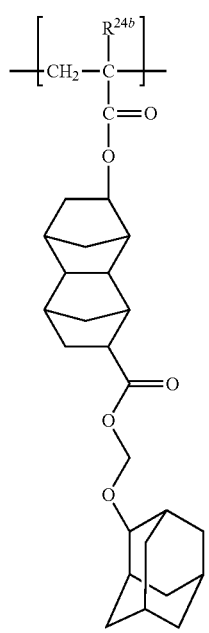
(b7-11)
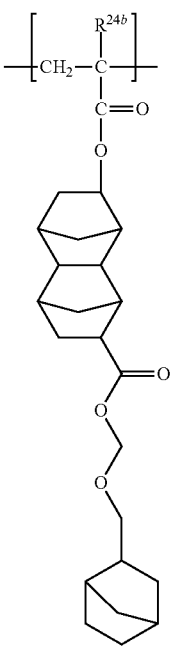

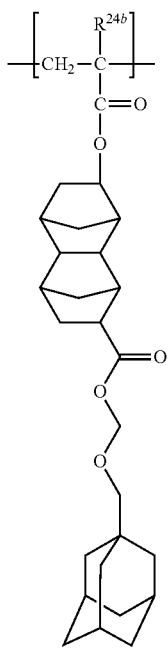
(b7-12)

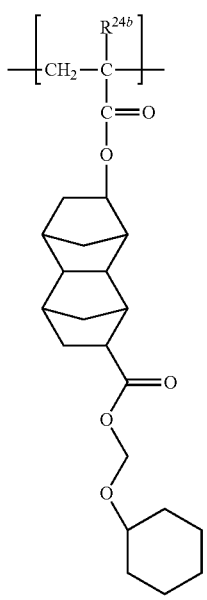
(b7-13)

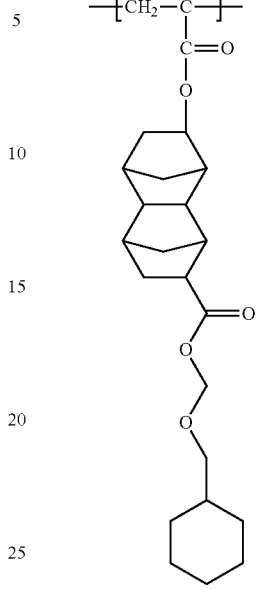
(b7-14)

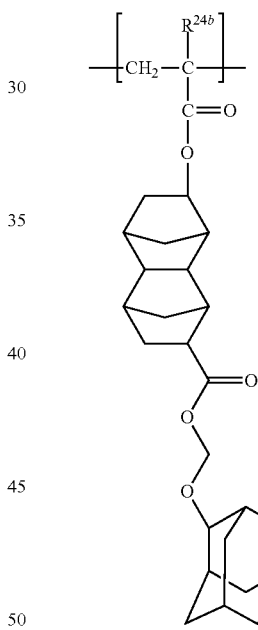
(b7-15)

In the formulas (b7-1) to (b7-15), $R^{24b}$ represents a hydrogen atom or a methyl group.

Among the structural units represented by the above-mentioned formulas (b5) to (b7), a structural unit represented by the formula (b6) is preferable, in view of easy synthesis and realization of relatively high sensitivity. In addition, in the structural unit represented by the formula (b6), a structural unit in which $Y^b$ is an alkyl group is preferable, and a structural unit in which either or both of $R^{19b}$ and $R^{20b}$ is an alkyl group is preferable.

Further, the (B-3) acrylic resin is preferably composed of a copolymer including the structural units represented by the formulas (b5) to (b7) and a structural unit derived from a polymerizable compound having ether bond.

Examples of the polymerizable compound having ether bond include radical polymerizable compounds such as (meth)acrylic acid derivatives having ether bond and ester bond, and specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)acrylate, and tetrahydrofurfuryl (meth)acrylate. In addition, the polymerizable compound having ether bond is preferably 2-methoxyethyl (meth)acrylate, 2-ethoxyethyl (meth)acrylate, or methoxytriethylene glycol (meth)acrylate. These polymerizable compounds may be used alone or in combination of two or more types thereof.

Further, the (B-3) acrylic resin may include other polymerizable compounds as a structural unit, for the purpose of appropriately controlling physical and chemical properties. Examples of the polymerizable compounds include conventional radical polymerizable compounds or anionic polymerizable compounds.

Examples of the polymerizable compounds include monocarboxylic acids such as acrylic acid, methacrylic acid, and crotonic acid; dicarboxylic acids such as maleic acid, fumaric acid, and itaconic acid; methacrylic acid derivatives having a carboxyl group and an ester bond, such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; alkyl (meth)acrylic esters such as methyl(meth)acrylate, ethyl (meth)acrylate, butyl (meth)acrylate, and cyclohexyl(meth) acrylate; hydroxyalkyl (meth)acrylic esters such as 2-hydroxyethyl (meth)acrylate and 2-hydroxypropyl (meth)acrylate; aryl (meth)acrylic esters such as phenyl (meth)acrylate and benzyl (meth)acrylate; dicarboxylic diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

As described above, the (B-3) acrylic resin may include a structural unit derived from the polymerizable compounds having a carboxyl group such as monocarboxylic acids and dicarboxylic acids. However, preferably, the (B-3) acrylic resin does not substantially include a structural unit derived from the polymerizable compounds having a carboxyl group, in a view of easily forming a resist pattern including a non-resist section of which the cross sectional shape is excellently rectangular without footing. Specifically, the ratio of the structural unit derived from the polymerizable compounds having a carboxyl group in the (B-3) acrylic resin is preferably 5 mass % or less, more preferably 3 mass % or less, and particularly preferably 1 mass % or less.

In addition, the examples of the polymerizable compounds include (meth)acrylic esters having a non-acid-dissociative aliphatic polycyclic group, and vinyl group-containing aromatic compounds. As the non-acid-dissociative aliphatic polycyclic group, particularly, a tricyclodecanyl group, an adamantyl group, a tetracyclododecanyl group, an isobornyl group, and a norbornyl group are preferable in a view of easy industrial availability. These aliphatic polycyclic groups may have a linear or branched alkyl group having 1 to 5 carbon atoms as a substituent.

Examples of the (meth)acrylic esters having a non-acid-dissociative aliphatic polycyclic group include those having structures represented by the following formulas (b8-1) to (b8-5).

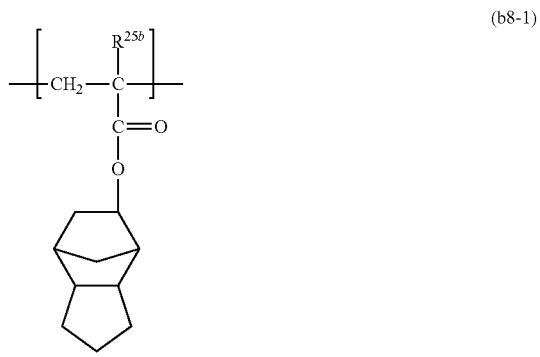

(b8-1)

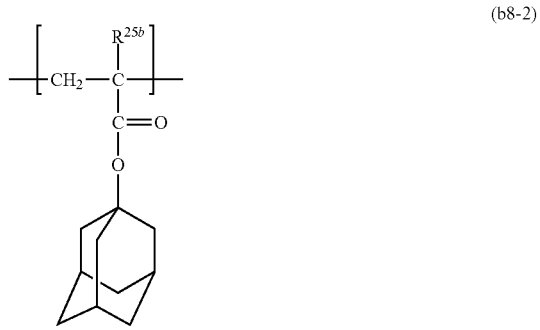

(b8-2)

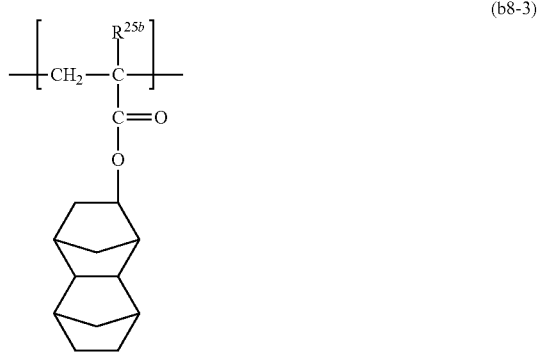

(b8-3)

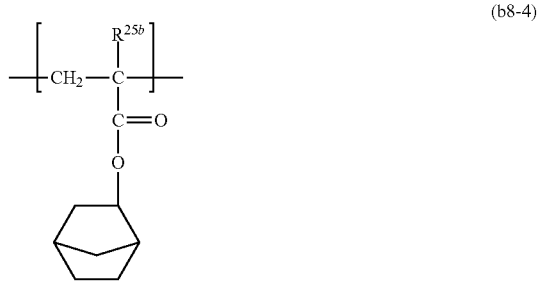

(b8-4)

-continued

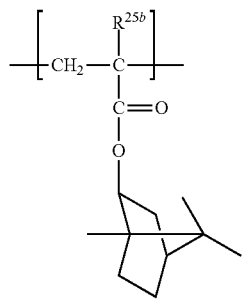

(b8-5)

In the formulas (b8-1) to (b8-5), $R^{25b}$ represents a hydrogen atom or a methyl group.

The (B-3) acrylic resin preferably includes a structural unit (b-3) including the cyclic group containing —$SO_2$— or the cyclic group containing lactone in an amount of 5 mass % or more, more preferably 10 mass % or more, particularly preferably 10 mass % to 50 mass %, and the most preferably 10 mass % to 30 mass %. When a photosensitive resin composition includes the structural unit (b-3) including the cyclic group containing —$SO_2$— or the cyclic group containing lactone within the amount of the above-mentioned range, it is possible to easily obtain both excellent developing property and a pattern shape.

In addition, the (B-3) acrylic resin preferably includes the structural units represented by the formulas (b5) to (b7) in an amount of 5 mass % or more, more preferably 10 mass % or more, and particularly preferably 10 mass % to 50 mass %.

The (B-3) acrylic resin preferably includes a structural unit derived from the polymerizable compounds having ether bond. The content of the structural unit derived from the polymerizable compounds having ether bond in the (B-3) acrylic resin is preferably 0 mass % to 50 mass % and more preferably 5 mass % to 30 mass %.

The (B-3) acrylic resin preferably includes a structural unit derived from the (meth)acrylic acid esters having a non-acid-dissociative aliphatic polycyclic group. The content of the structural unit derived from the (meth)acrylic acid esters having a non-acid-dissociative aliphatic polycyclic group in the (B-3) acrylic resin is preferably 0 mass % to 50 mass % and more preferably 5 mass % to 30 mass %.

As long as a photosensitive resin composition contains the (B-3) acrylic resin in a predetermined amount, an acrylic resin other than the above-mentioned (B-3) acrylic resin may be used as the (B) resin. The acrylic resin other than the (B-3) acrylic resin is not particularly limited, if the resin includes structural units represented by the formulas (b5) to (b7).

The polystyrene-equivalent mass average molecular weight of the above-mentioned (B) is preferably 10,000 to 600,000, more preferably 20,000 to 400,000, and still more preferably 30,000 to 300,000. By adjusting the mass average molecular weight, the photosensitive resin layer can maintain sufficient strength without deteriorating peeling properties with a substrate, and also swelling of profiles in plating, and generation of cracks can be prevented.

A dispersivity of the resin (B) is preferably 1.05 or more. The dispersivity as mentioned herein indicates a value of a mass average molecular weight divided by a number average molecular weight. By adjusting the dispersivity in the range described above, problems with respect to stress resistance on intended plating or possible swelling of metal layers resulting from the plating process can be avoided.

The content of the resin (B) is preferably 5 mass % to 60 mass % with respect to the total mass of the photosensitive resin composition.

(C) Alkali-Soluble Resin

The photosensitive resin composition may further contain an alkali-soluble resin (C) as necessary in order to improve crack resistance. The alkali-soluble resin as mentioned herein may be determined as follows. A solution of the resin to give a resin concentration of 20 mass % (solvent: propylene glycol monomethyl ether acetate) is used to form a resin film having a film thickness of 1 μm on a substrate, followed by immersion in an aqueous 2.38 mass % TMAH solution for 1 min. If the resin was dissolved in an amount of 0.01 μm or more, the resin is defined to be alkali-soluble.

As the (C) alkali-soluble resin, various resins which are used to be mixed in the positive-type photosensitive resin composition from the related art may be used within a range of not impairing the purpose of the present invention. However, the photosensitive resin composition preferably does not include a resin having a carboxyl group as an alkali-soluble group. The (C) alkali-soluble resin is preferably at least one resin selected from the group consisting of a (C1) novolac resin, a (C2) polyhydroxystyrene resin, and a (C3) acrylic resin.

(C1) Novolac Resin

The novolak resin (C1) may be prepared by addition condensation between, for example, aromatic compounds having a phenolic hydroxy group (hereinafter, simply referred to as "phenols") and aldehydes in the presence of an acid catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, and β-naphthol.

Examples of the aldehydes include formaldehyde, furfural, benzaldehyde, nitrobenzaldehyde, and acetaldehyde.

The catalyst used in the addition condensation reaction is not particularly limited, but the examples thereof include hydrochloric acid, nitric acid, sulfuric acid, formic acid, oxalic acid, and acetic acid in the case of an acid catalyst.

Furthermore, the flexibility of the novolak resins can be enhanced even more when o-cresol is used, a hydrogen atom of a hydroxyl group in the resins is substituted with other substituents, or bulky aldehydes are used.

The mass average molecular weight of the novolak resin (C1) is not particularly limited within a range not impairing the purpose of the present invention, and is preferably 1,000 to 50,000.

(C2) Polyhydroxystyrene Resin

Examples of the hydroxystyrene-based compound constituting the (C2) polyhydroxystyrene resin include p-hydroxystyrene, α-methylhydroxystyrene, and α-ethylhydroxystyrene.

Further, the (C2) polyhydroxystyrene resin is preferably prepared to be a copolymer with a styrene resin. Examples of the styrene-based compound constituting the styrene resin include styrene, chlorostyrene, chloromethylstyrene, vinyltoluene, and α-methylstyrene.

The mass average molecular weight of the (C2) polyhydroxystyrene resin is not particularly limited within a range not impairing the purpose of the present invention, and is preferably 1,000 to 50,000.

(C3) Acrylic Resin

The (C3) acrylic resin preferably includes a structural unit derived from the polymerizable compounds having ether bond and a structural unit derived from the polymerizable compounds having a carboxyl group.

Examples of the polymerizable compound having ether bond include (meth)acrylic acid derivatives having ether bond and ester bond such as 2-methoxyethyl(meth)acrylate, methoxytriethylene glycol(meth)acrylate, 3-methoxybutyl (meth)acrylate, ethylcarbitol(meth)acrylate, phenoxypolyethylene glycol(meth)acrylate, methoxypolypropylene glycol(meth)acrylate, and tetrahydrofurfuryl(meth)acrylate. The polymerizable compound having ether bond is preferably, 2-methoxyethyl acrylate or methoxytriethylene glycol acrylate. These polymerizable compounds may be used alone or in combination of two or more types thereof.

Examples of the polymerizable compound having a carboxyl group include monocarboxylic acids such as acrylic acid, methacrylic acid, and crotonic acid; dicarboxylic acids such as maleic acid, fumaric acid, and itaconic acid; and a compound having a carboxyl group and ester bond such as 2-methacryloyloxyethyl succinic acid, 2-methacryloyloxyethyl maleic acid, 2-methacrylolyoxyethyl phthalic acid, or 2-methacryloyloxyethyl hexahydrophthalic acid. The polymerizable compound having a carboxyl group is preferably acrylic acid or methacrylic acid. These polymerizable compounds may be used alone or in combination of two or more types thereof.

The mass average molecular weight of the acrylic resin (C3) is preferably 50,000 to 800,000 within a range of not impairing the purpose of the present invention.

The (C) alkali-soluble resin is used such that the content of the (B-3) acrylic resin containing a structural unit derived from acrylic ester having a cyclic group containing —$SO_2$— or a cyclic group containing lactone is 70 mass % or more with respect to the total mass of the (B) resin and the (C) alkali-soluble resin in the photosensitive resin composition. Therefore, the content of the (C) alkali-soluble resin in the photosensitive resin composition is 30 mass % or less, preferably 20 mass % or less, more preferably 10 mass % or less, and particularly preferably 0 mass % with respect to the total amount of the (B) resin and the (C) alkali-soluble resin. As the content of the (C) alkali-soluble resin is lower, the sensitivity of the photosensitive resin composition becomes excellent.

(D) Acid Diffusion Control Agent

In order to have an excellent pattern shape and improve the post exposure stability of a photosensitive resin film, the photosensitive resin composition preferably further contains an (D) acid diffusion control agent. As the (D) acid diffusion control agent, a (D1) nitrogen-containing compound is preferable, and the agent may contain an (D2) organic carboxylic acid, or an oxo acid of phosphorus or a derivative thereof as necessary.

(D1) Nitrogen-Containing Compound

Examples of the (D1) nitrogen-containing compound include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri(2-pyridyl)-S-triazine, morpholine, 4-methylmorpholine, piperazine, 1,4-dimethylpiperazine, 1,4-diazabicyclo[2.2.2]octane, and pyridine. These may be used alone or in combination of two or more types thereof.

The (D1) nitrogen-containing compound is used generally within a range of 0 parts by mass to 5 parts by mass, and particularly preferably within a range of 0 parts by mass to 3 parts by mass with respect to the total 100 parts by mass of the (B) resin and the (C) alkali-soluble resin.

(D2) Organic Carboxylic Acid or Oxo Acid of Phosphorus or Derivative Thereof

Among the (D2) organic carboxylic acid, or the oxo acid of phosphorus or a derivative thereof, the specific preferable examples of the organic carboxylic acid include malonic acid, citric acid, malic acid, succinic acid, benzoic acid, and salicylic acid, and salicylic acid is particularly preferable.

Examples of the oxo acid of phosphorus or a derivative thereof include phosphoric acid and derivatives thereof such as esters thereof such as phosphoric acid, phosphoric acid di-n-butyl ester, and phosphoric acid diphenyl ester; phosphonic acid and derivatives thereof such as esters thereof such as phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as esters thereof such as phosphinic acid and phenylphosphinic acid. Among these, phosphonic acid is particularly preferred. These may be used alone or in combination of two or more types thereof.

The (D2) organic carboxylic acid or the oxo acid of phosphorus or a derivative thereof is used generally within a range of 0 parts by mass to 5 parts by mass, and particularly preferably within a range of 0 parts by mass to 3 parts by mass with respect to the total 100 parts by mass of the (B) resin and the (C) alkali-soluble resin.

Moreover, in order to form a salt to allow for stabilization, the (D2) organic carboxylic acid, or the oxo acid of phosphorous or the derivative thereof is preferably used in the same amount as that of the (D1) nitrogen-containing compound.

(S) Organic Solvent

The photosensitive resin composition contains an (S) organic solvent for the purpose of adjusting coatability. The type of the (S) organic solvent is not particularly limited within a range of not impairing the purpose of the present invention, and a solvent appropriately selected from the organic solvents which have been used in the positive-type photosensitive resin composition from the related art may be used.

Examples of the (S) organic solvent include ketones such as acetone, methyl ethyl ketone, cyclohexanone, methyl isoamyl ketone, and 2-heptanone; polyols and derivatives thereof, such as ethylene glycol, ethylene glycol monoacetate, diethylene glycol, diethylene glycol monoacetate, propylene glycol, propylene glycol monoacetate, dipropylene glycol, and dipropylene glycol monoacetate and monomethyl ethers, monoethyl ethers, monopropyl ethers, monobutyl ethers, and monophenyl ethers thereof; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate, and 3-methyl-3-methoxybutyl acetate; and aromatic hydrocarbons such as toluene and xylene. These may be used alone or in combination of two or more types thereof.

The content of the (S) organic solvent is not particularly limited within a range of not impairing the purpose of the present invention. When the photosensitive resin composition is used for a thick film such that the film thickness of the photosensitive resin layer obtained by a spin-coating method is 10 μm or more, the (S) organic solvent is preferably used within a range in which a solid concentration of the photosensitive resin composition is 20 mass % to 70 mass % and preferably 30 mass % to 55 mass %.

Method for Preparing Chemically Amplified Positive-Type Photosensitive Resin Composition The chemically amplified positive-type photosensitive resin composition is prepared by mixing and stirring each of the above-mentioned components by a common method. Examples of the apparatus which can be used when mixing and stirring each of the above-mentioned components include a dissolver, a homogenizer, or a three-roll mill. After each of the above-mentioned components is mixed uniformly, the obtained mixture is further filtrated using a mesh, a membrane filter, or the like.

Method for Producing a Thick Film Resist Pattern

A method for producing a thick film resist pattern using the photosensitive resin composition described above is not particularly limited, and the preferable examples of the method include a method including laminating a photosensitive resin layer formed of the photosensitive resin composition on a substrate; irradiating the photosensitive resin layer with an active beam or radiation; and developing the exposed photosensitive resin layer.

The substrate on which the photosensitive resin layer is laminated is not particularly limited, the substrates known in the art may be used, and for example, a substrate for electronic parts and a substrate on which a predetermined wiring pattern is formed can be exemplified. Examples of the substrate include substrates made of metals such as silicon, silicon nitride, titanium, tantalum, palladium, titanium tungsten, copper chromium, iron, aluminum and a glass substrate. As a material of the wiring pattern, for example, copper, solder, chromium, aluminum, nickel, and gold are used.

The photosensitive resin layer is laminated on the substrate, for example, as described below. Specifically, a liquid photosensitive resin composition is applied on the substrate, and a solvent is removed by heating the substrate to form a photosensitive resin layer having a desired film thickness. The thickness of the photosensitive resin layer is not particularly limited, if the thickness is enough to form a resist pattern having a film thickness of 10 μm or more. The thickness of the photosensitive resin layer is not particularly limited, and 10 μm to 150 μm is preferable, 20 μm to 120 μm is more preferable, and 20 μm to 100 μm is particularly preferable.

As a method for applying the photosensitive resin composition on the substrate, a method such as a spin-coating method, a slit-coating method, a roll-coating method, a screen-printing method, and an applicator method may be employed. It is preferable to perform prebaking with respect to the photosensitive resin layer. The prebaking conditions may vary depending on the type of respective components in the photosensitive resin composition, the mixing ratio, and the coated film thickness, and the conditions are usually 70° C. to 150° C. and preferably 80° C. to 140° C., for about 2 minutes to 60 minutes.

The photosensitive resin layer formed as described above is selectively irradiated (exposed) with an active beam or radiation, for example, an ultraviolet ray having a wavelength of 300 nm to 500 nm or visible lights, via a predetermined pattern mask.

Low-pressure mercury vapor lamps, high-pressure mercury vapor lamps, ultrahigh-pressure mercury vapor lamps, metal halide lamps, argon gas lasers, or the like may be used for the radiation source of the radiation. Examples of the radiation include micro waves, infrared rays, visible lights, ultraviolet rays, X-rays, γ-rays, electron beams, proton beams, neutron beams, and ion beams. The irradiation dose of the radiation may vary depending on the composition of the photosensitive resin composition and the film thickness of the photosensitive resin layer. For example, in a case where an ultrahigh-pressure mercury vapor lamp is used, the dose is 100 mJ/cm$^2$ to 10,000 mJ/cm$^2$. Further, the radiation includes a light ray to activate the (A) acid generator in order to produce an acid.

After the exposure, diffusion of the acid is promoted through heating the photosensitive resin layer by the conventional methods, followed by changing the alkali solubility of the photosensitive resin layer in this exposed area of the photosensitive resin film.

Next, the exposed photosensitive resin layer is developed by the methods known in the art, and an insoluble area is dissolved and removed, thereby forming a predetermined resist pattern. At this time, as a developing solution, an alkaline aqueous solution is used.

As the developing solution, an aqueous solution of an alkali such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5,4,0]-7-undecene, and 1,5-diazabicyclo[4,3,0]-5-nonane may be used. Also, an aqueous solution prepared by adding an appropriate amount of a water-soluble organic solvent such as methanol and ethanol, or a surfactant to the aqueous solution of the alkali may be used as the developing solution.

The developing time may vary depending on the composition of the photosensitive resin composition and the film thickness of the photosensitive resin layer. The developing time is usually 1 minute to 30 minutes. The method of the development may be any one of a liquid-filling method, a dipping method, a puddle method, and a spray developing method.

After development, washing with flowing water is carried out for 30 seconds to 90 seconds, and drying is performed by using an air gun, an oven, or the like. In this way, a resist pattern can be produced.

Method for Producing Substrate with a Mold

In the substrate with a mold including a mold for forming a plated molded article, a resist pattern formed by using the photosensitive resin composition is used as the mold. A non-resist section in the resist pattern is filled with a metal by plating, and a plated molded article is formed.

When the substrate with a mold is formed, a metal substrate is used as the substrate. In addition, in the metal substrate, a material of the surface on which a plated molded article is formed is preferably a metal. Therefore, in the metal substrate, the entire parts may be made of a metal, or at least part of the surface on which a plated molded article is formed may be made of a metal. As the material of the substrate, the preferable examples of the metal include copper, gold, and aluminum, and more preferably copper.

The substrate with a mold is produced in the same manner as the method for producing a thick film resist pattern, except that the above-mentioned metal substrate is used as the substrate, and the shape of the non-resist section in the resist pattern is designed to adjust the shape of the plated molded article.

Method for Producing a Plated Molded Article

A plated molded article such as connecting terminals, for example, bumps and metal posts can be formed by embedding a conductor such as a metal, by means of plating or the like, in a non-resist section (an area that has been removed by a developing solution) in the substrate with a mold formed by the above-mentioned method. Further, there are no particular limitations on the plating treatment method, and various methods that are known in the art can be employed. As the plating liquid, in particular, liquids for solder plating, copper plating, gold plating, and nickel plating are suitably used. Finally, any residual mold is removed by using a stripping solution according to a common method.

According to the above-mentioned method for producing a plated molded article, since a plated molded article is formed using the mold including a non-resist section of which the cross sectional shape is excellently rectangular without footing, using the photosensitive resin composition, the cross sectional shape of the plated molded article to be formed is preferable rectangular.

EXAMPLES

Hereinafter, the present invention will be described in more detail with reference to Examples, but the scope of the present invention is not limited to these Examples.

Examples 1 to 8 and Comparative Examples 1 to 7

In Examples, the following PAG-A to PAG-E were used as the (A) acid generator.

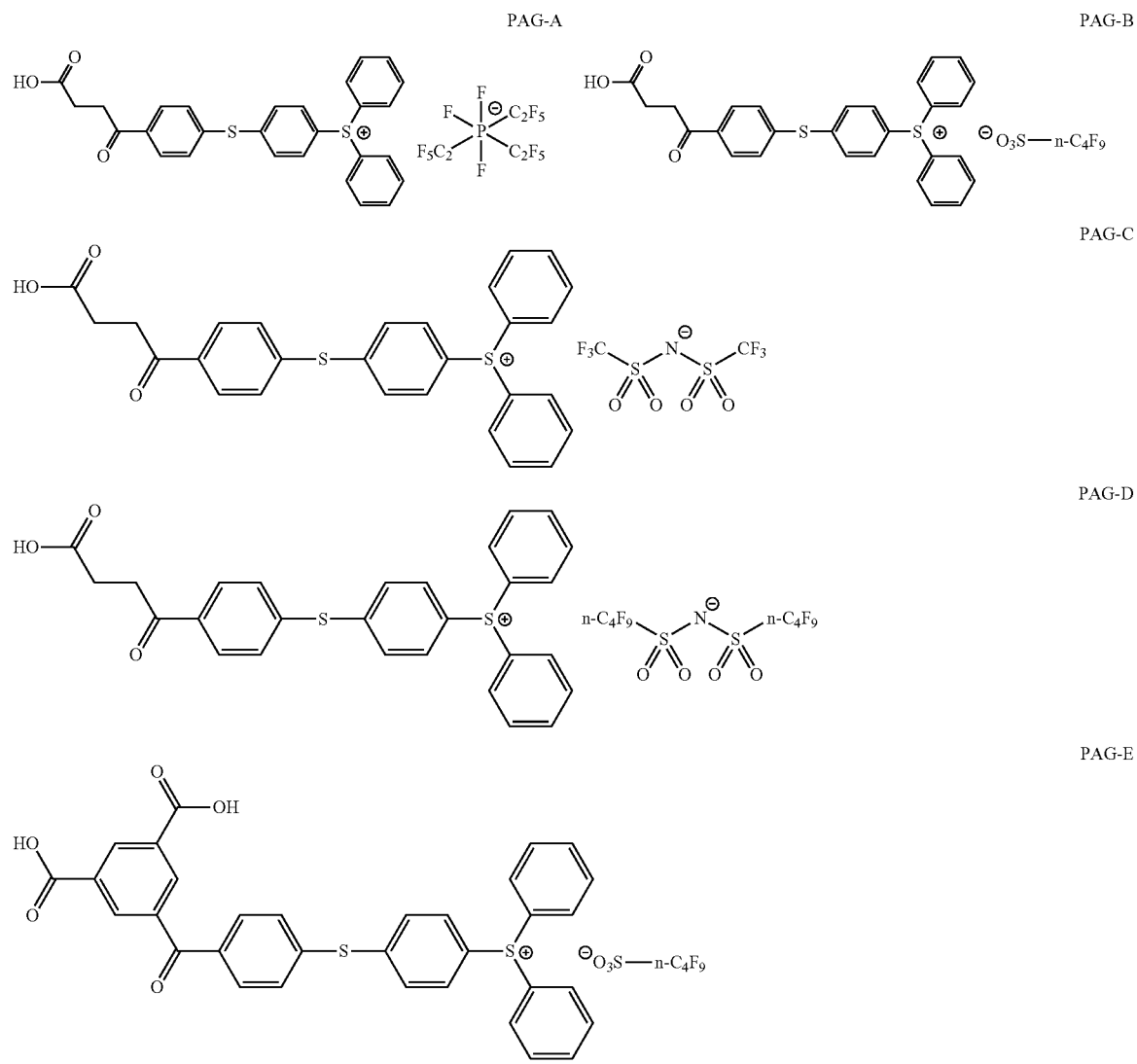

In Comparative Examples, the following PAG-F and PAG-G were used as the (A) acid generator.

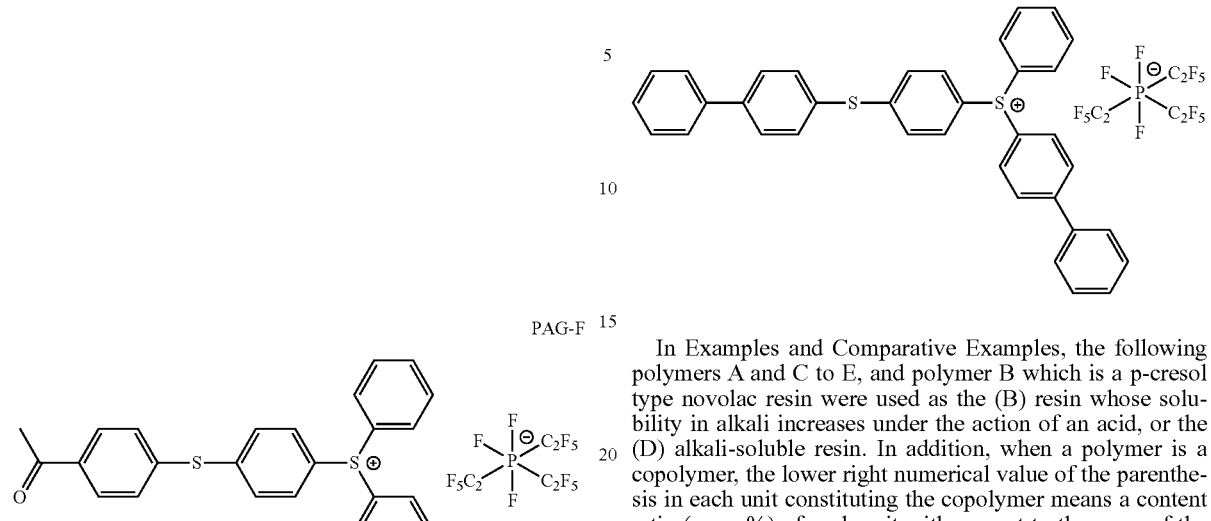

In Examples and Comparative Examples, the following polymers A and C to E, and polymer B which is a p-cresol type novolac resin were used as the (B) resin whose solubility in alkali increases under the action of an acid, or the (D) alkali-soluble resin. In addition, when a polymer is a copolymer, the lower right numerical value of the parenthesis in each unit constituting the copolymer means a content ratio (mass %) of each unit with respect to the mass of the copolymer. Also, the mass average molecular weight (Mw) and dispersivity (Mw/Mn) of the polymers A to E are shown in Table 1.

Polymers A

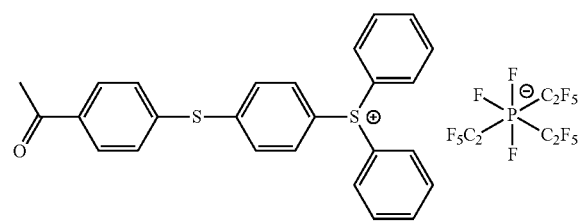

Polymers C

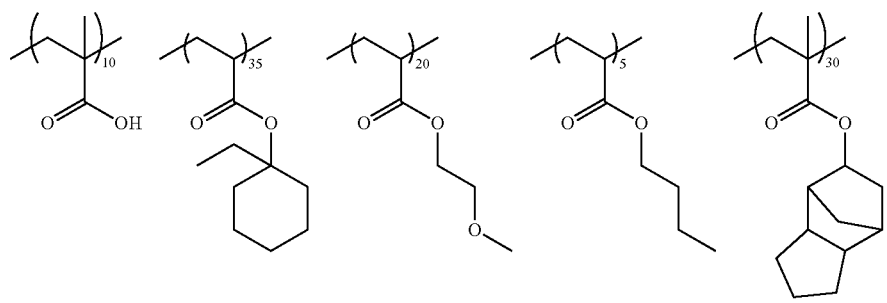

Polymers D

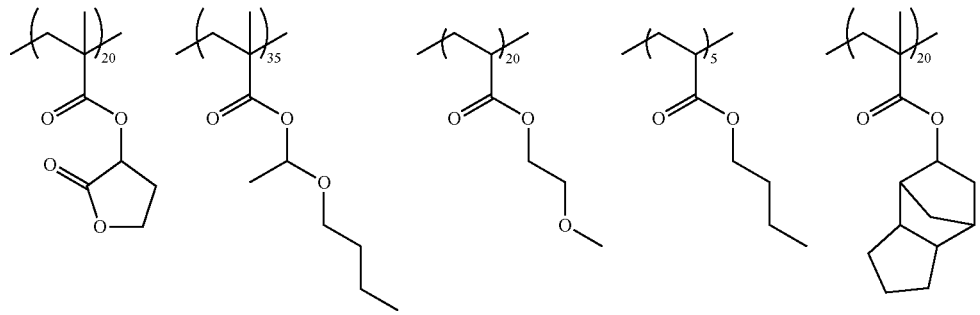

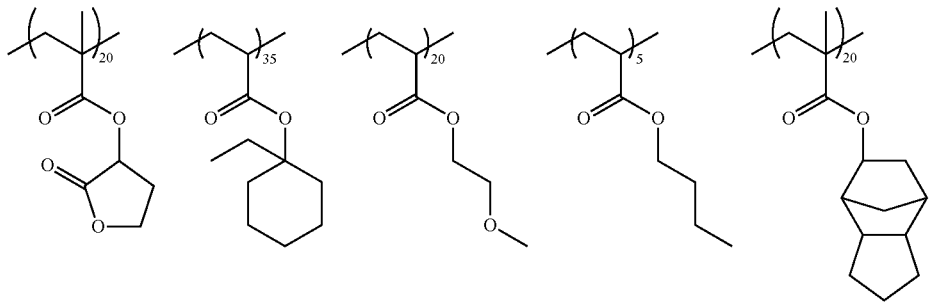

Polymers E

TABLE 1

| | Mass average molecular weight (Mw) | Dispersivity (Mw/Mn) |
| --- | --- | --- |
| Polymer A | 12,000 | 2.4 |
| Polymer B | 8,000 | 6.2 |
| Polymer C | 40,000 | 2.6 |
| Polymer D | 40,000 | 2.7 |
| Polymer E | 40,000 | 2.7 |

In Examples and Comparative Examples, tri-n-pentylamine was used as the acid diffusion control agent.

The resin (the type and amount thereof are shown in Table 2), 5 parts by mass of the acid generator (the type thereof is shown in Table 2), and 0.02 parts by mass of the acid diffusion control agent were dissolved in 3-methoxybutylacetate such that the concentration of the resin component becomes 55 mass % to obtain a photosensitive resin composition.

In the thick film resist pattern formed by using the obtained photosensitive resin composition, a cross sectional shape of the non-resist section in the thick film resist pattern was evaluated according to the following methods.

Evaluation of Cross Sectional Shape of Non-Resist Section

The photosensitive resin compositions of Examples 1 to 8 and Comparative Examples 1 to 7 each was coated on an 8-inch copper substrate using a spin coater, thereby obtaining a photosensitive resin layer having a film thickness of 100 μm, which is capable of forming a resist pattern. Further, this photosensitive resin layer was sequentially prebaked at 100° C. for 2 minutes and 150° C. for 5 minutes, and after prebaking, the layer was subjected to patternwise exposure to line ghi, by using a mask with a predetermined hole pattern having a diameter of 60 μm and an exposing apparatus Prisma GHI (manufactured by Ultratech, Inc.). Subsequently, the substrate was placed and heated on a hot plate for 3 minutes at 85° C. to perform baking after exposure (PEB) was carried out. Thereafter, an aqueous 2.38%-by-mass solution of tetramethylammonium hydroxide (TMAH) was added dropwise to the photosensitive resin layer and then the photosensitive resin layer was left to stand for 60 seconds at 23° C. Development was performed by repeating this operation 4 times in total. Thereafter, the layer was washed with flowing water, and then subjected to nitrogen blowing to obtain a thick film resist pattern having a contact hole pattern having a diameter of 60 μm.

The cross section vertical to the surface direction of the resist pattern of the non-resist section (hole) in the formed resist pattern was observed by a scanning microscope, the diameter $CD_{(Bottom)}$ of the bottom portion of the hole corresponding to the substrate surface and the hole diameter $CD_{(Bottom+10\ \mu m)}$ of the portion 10 μm separated from the bottom portion were measured, and the degree of formation of footing was evaluated in the hole cross section using the value of $CD_{(Bottom+10\ \mu m)}/CD_{(Bottom)}$. As the value of $CD_{(Bottom+10\ \mu m)}/CD_{(Bottom)}$ is smaller, the degree of formation of footing is high. Also, A indicates excellence in evaluation. The evaluation result of the cross section of the non-resist section is shown in Table 2.

A: $CD_{(Bottom+10\ \mu m)}/CD_{(Bottom)}$ is less than 1.03.
B: $CD_{(Bottom+10\ \mu m)}/CD_{(Bottom)}$ is 1.03 to 1.05.
C: $CD_{(Bottom+10\ \mu m)}/CD_{(Bottom)}$ exceeds 1.05.

TABLE 2

| | Resin (type/parts by mass) | Acid generator (type) | Non-resist section Evaluation of cross sectional shape |
| --- | --- | --- | --- |
| Example 1 | D/100 | PAG-A | A |
| Example 2 | D/100 | PAG-B | A |
| Example 3 | D/100 | PAG-C | A |
| Example 4 | D/100 | PAG-D | A |
| Example 5 | D/100 | PAG-E | A |
| Example 6 | D/80 A/20 | PAG-A | A |
| Example 7 | D/80 B/20 | PAG-A | A |
| Example 8 | E/100 | PAG-A | A |
| Comparative Example 1 | A/20 B/40 C/40 | PAG-A | B |
| Comparative Example 2 | A/20 B/40 C/40 | PAG-F | C |
| Comparative Example 3 | A/20 B/40 C/40 | PAG-G | C |
| Comparative Example 4 | D/100 | PAG-F | C |
| Comparative Example 5 | D/100 | PAG-G | C |
| Comparative Example 6 | E/100 | PAG-F | C |
| Comparative Example 7 | E/100 | PAG-G | C |

According to Examples 1 to 8, it can be seen that when a photosensitive resin composition including an (A) acid generator capable of producing an acid when irradiated with an active beam or radiation, and including a compound having a carboxyl group; a (B) resin whose solubility in alkali increases under the action of an acid, and which includes an (B-3) acrylic resin containing a structural unit derived from acrylic ester having a cyclic group containing —SO$_2$— or a cyclic group containing lactone; and an (S)

organic solvent, it is possible to form a resist pattern including a non-resist section of which the cross sectional shape is excellently rectangular without footing.

According to Comparative Example 1, it can be seen that even though the photosensitive resin composition includes a compound having a carboxyl group as the acid generator, when the composition only including the resin not containing a structural unit derived from acrylic ester having a cyclic group containing —SO$_2$— or a cyclic group containing lactone as the resin, is used, small footing is easily generated.

According to Comparative Examples 2 to 7, it can be seen that when the photosensitive resin composition not including a compound having a carboxyl group as the acid generator is used, formation of footing in the resist pattern is remarkable.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:
1. A composition applied to a copper substrate, wherein said composition is a chemically amplified positive-type photosensitive resin composition capable of forming a thick film having a film thickness of 10 μm or more, said composition comprising:
  a compound having a carboxyl group represented by general formula (a1) below, wherein the compound having a carboxyl group is an acid generator (PAG) which is capable of producing an acid when irradiated with an active beam or radiation;

wherein X is a linking group having a valence of t+1, t and u each independently are an integer of 1 or more, Y is a PAG group represented by the following formula (a2), except that hydrogen atoms in the number of u are removed from at least one of the R$^{1a}$ moieties in the formula (a2):

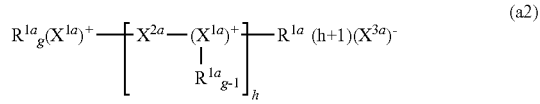

wherein X$^{1a}$ represents a sulfur atom having a valence of g or an iodine atom, g is 1 or 2, h represents the number of repeating units in the structure within parentheses including 0, R$^{1a}$ is an organic group that is bonded to X$^{1a}$, and represents an aryl group having 6 to 30 carbon atoms, a heterocyclic group having 4 to 30 carbon atoms, or an alkyl group having 1 to 30 carbon atoms, R$^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen, the number of R$^{1a}$'s is g+h(g−1)+1, the R$^{1a}$'s may be respectively the same as or different from each other, the two or more R$^{1a}$s may be bonded to each other directly or via —O—, —S—, —SO—, —SO$_2$—, —NH—, —NR$^{2a}$—, —CO—, —COO—, —CONH—, an alkylene group having 1 to 3 carbon atoms, or a phenylene group to form a ring structure containing X$^{1a}$, R$^{2a}$ is an alkyl group having 1 to 5 carbon atoms or an aryl group having 6 to 10 carbon atoms, and X$^{2a}$ is a structure represented by the following formula (a3):

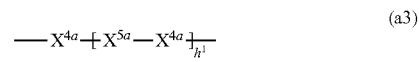

wherein X$^{4a}$ represents an alkylene group having 1 to 8 carbon atoms, an arylene group having 6 to 20 carbon atoms, or a divalent group derived from a heterocyclic compound having 8 to 20 carbon atoms, X$^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and halogen, X$^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group, h$^1$ represents the number of repeating units of the structure within parentheses including 0, X$^{4a}$'s in the number of h$^1$+1 and X$^{5a}$'s in the number of h$^1$ may be the same as or different from each other, R$^{2a}$ has the same definition as described above, and X$^{3a-}$ is an organic anion;
  a resin whose solubility in alkali increases under the action of an acid and which includes an acrylic resin containing a structural unit derived from acrylic ester having a cyclic group containing —SO$_2$— or a cyclic group containing a lactone; and
  an organic solvent.

2. The composition applied to the copper substrate according to claim 1, wherein the mass ratio of the acrylic resin is 70 mass % or more with respect to the total mass of a resin component included in the chemically amplified positive-type photosensitive resin composition for a thick film.

3. The composition applied to the copper substrate according to claim 1, wherein the cation moiety in the PAG group Y of the formula (a2) is a sulfonium ion represented by the following formula (a4):

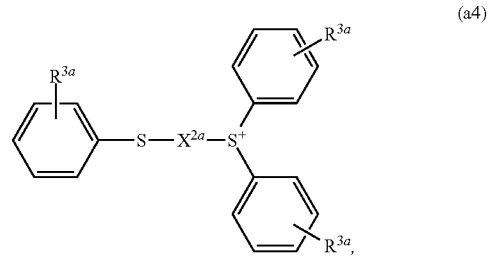

wherein R$^{3a}$'s each independently represent a group selected from the group consisting of a hydrogen atom, an alkyl group, a hydroxy group, an alkoxy group, an alkylcarbonyl group, an alkylcarbonyloxy group, an alkyloxycarbonyl group, a halogen atom, an aryl group which may have a substituent, and an arylcarbonyl group, and $X^{2a}$ has the same definition as $X^{2a}$ in the formula (a2).

4. The composition applied to the copper substrate according to claim 1, wherein the cation moiety in the PAG group Y of the formula (a2) is a sulfonium ion represented by the following formula (a5):

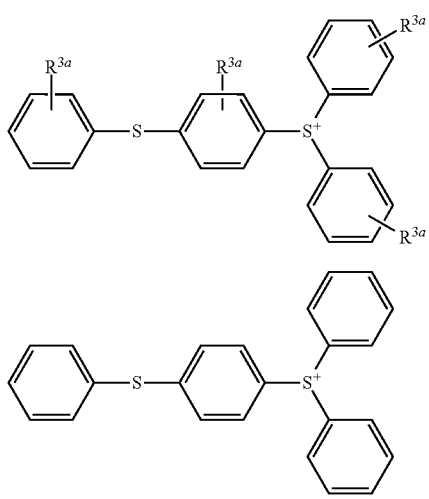

(a5)

(a5-1)

wherein $R^{3a}$ s have the same definition as $R^{3a}$'s in the formula (a4).

5. The composition applied to the copper substrate according to claim 1, wherein the cation moiety in the PAG group Y of the formula (a2) is a sulfonium ion represented by the following formula (a5-1):

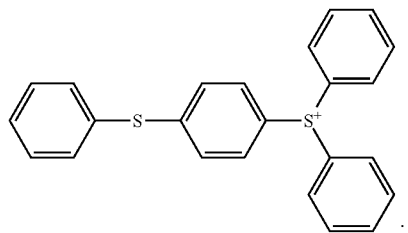

(a5-1)

6. The composition applied to the copper substrate according to claim 1, wherein the compound having a carboxyl group represented by the general formula (a1) is at least one of PAG-A to PAG-E represented by the following formulas:

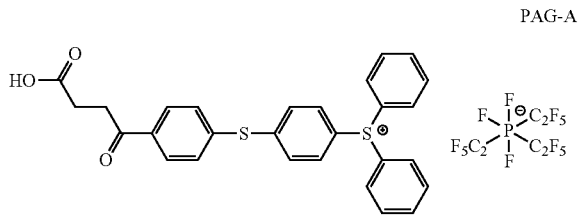

PAG-A

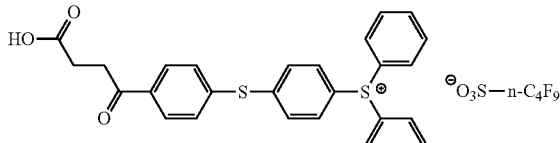

PAG-B

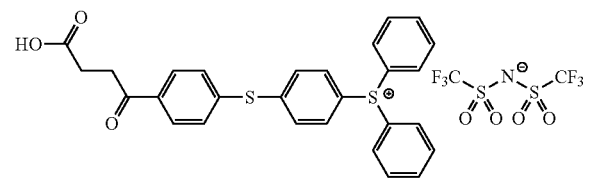

PAG-C

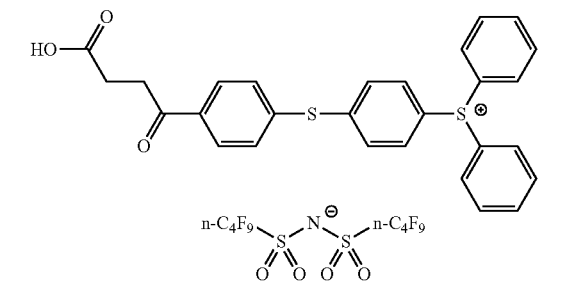

PAG-D

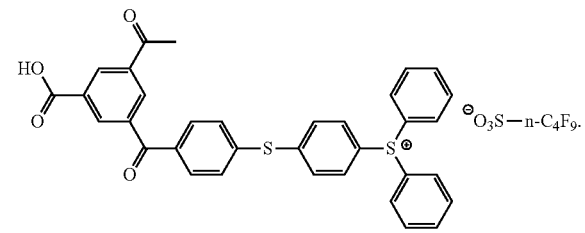

PAG-E

7. A method for producing a thick film resist pattern, comprising:
laminating a photosensitive resin layer formed from a chemically amplified positive-type photosensitive resin composition on a copper substrate;
irradiating the photosensitive resin layer with an active beam or radiation; and
developing the exposed photosensitive resin layer;
wherein said photosensitive resin layer is suitable for forming a thick film having a film thickness of 10 µm or more on the copper substrate, said chemically amplified positive-type photosensitive resin composition comprising:
a compound having a carboxyl group represented by general formula (a1) below, wherein the compound having a carboxyl group is an acid generator (PAG) which is capable of producing an acid when irradiated with an active beam or radiation;

$$Y—(X—(COOH)_t)_u \quad (a1)$$

wherein X is a linking group having a valence of t+1, t and u each independently are an integer of 1 or more, Y is a PAG group represented by the following formula (a2), except that hydrogen atoms in the number of u are removed from at least one of the $R^{1a}$ moieties in the formula (a2):

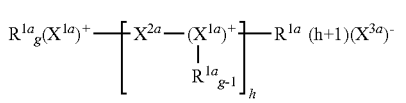

wherein $X^{1a}$ represents a sulfur atom having a valence of g or an iodine atom, g is 1 or 2, h represents the number of repeating units in the structure within parentheses including 0, $R^{1a}$ is an organic group that is bonded to $X^{1a}$, and represents an aryl group having 6 to 30 carbon atoms, a heterocyclic group having 4 to 30 carbon atoms, or an alkyl group having 1 to 30 carbon atoms, $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen, the number of $R^{1a}$'s is g+h(g−1)+1, the $R^{1a}$'s may be respectively the same as or different from each other, the two or more $R^{1a}$s may be bonded to each other directly or via —O—, —S—, —SO—, —SO$_2$—, —NH—, —NR$^{2a}$—, —CO—, —COO—, —CONH—, an alkylene group having 1 to 3 carbon atoms, or a phenylene group to form a ring structure containing $X^{1a}$, $R^{2a}$ is an alkyl group having 1 to 5 carbon atoms or an aryl group having 6 to 10 carbon atoms, and $X^{2a}$ is a structure represented by the following formula (a3):

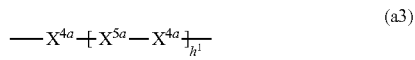

wherein $X^{4a}$ represents an alkylene group having 1 to 8 carbon atoms, an arylene group having 6 to 20 carbon atoms, or a divalent group derived from a heterocyclic compound having 8 to 20 carbon atoms, $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and halogen, $X^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group, $h^1$ represents the number of repeating units of the structure within parentheses including 0, $X^{4a}$'s in the number of $h^1$+1 and $X^{5a}$'s in the number of $h^1$ may be the same as or different from each other, $R^{2a}$ has the same definition as described above, and $X^{3a}$ is an organic anion;

a resin whose solubility in alkali increases under the action of an acid and which includes an acrylic resin containing a structural unit derived from acrylic ester having a cyclic group containing —SO$_2$— or a cyclic group containing a lactone; and
an organic solvent.

8. A method for producing a copper substrate with a mold, comprising:
laminating a photosensitive resin layer formed from the chemically amplified positive-type photosensitive resin composition on a copper substrate;
irradiating the photosensitive resin layer with an active beam or radiation; and
developing the exposed photosensitive resin layer to fabricate a mold for forming a plated molded article;
wherein said photosensitive resin layer is suitable for forming a thick film having a film thickness of 10 μm or more on the copper substrate, said chemically amplified positive-type photosensitive resin composition comprising:
a compound having a carboxyl group represented by general formula (a1) below, wherein the compound having a carboxyl group is an acid generator (PAG) which is capable of producing an acid when irradiated with an active beam or radiation;

$$Y-(X-(COOH)_t)_u \quad (a1)$$

wherein X is a linking group having a valence of t+1, t and u each independently are an integer of 1 or more, Y is a PAG group represented by the following formula (a2), except that hydrogen atoms in the number of u are removed from at least one of the $R^{1a}$ moieties in the formula (a2):

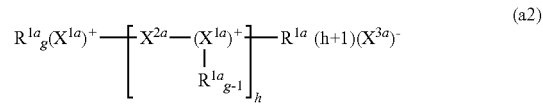

wherein $X^{1a}$ represents a sulfur atom having a valence of g or an iodine atom, g is 1 or 2, h represents the number of repeating units in the structure within parentheses including 0, $R^{1a}$ is an organic group that is bonded to $X^{1a}$, and represents an aryl group having 6 to 30 carbon atoms, a heterocyclic group having 4 to 30 carbon atoms, or an alkyl group having 1 to 30 carbon atoms, $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen, the number of $R^{1a}$'s is g+h(g−1)+1, the $R^{1a}$'s may be respectively the same as or different from each other, the two or more $R^{1a}$s may be bonded to each other directly or via —O—, —S—, —SO—, —SO$_2$—, —NH—, —NR$^{2a}$—, —CO—, —COO—, —CONH—, an alkylene group having 1 to 3 carbon atoms, or a phenylene group to form a ring structure containing $X^{1a}$, $R^{2a}$ is an alkyl group having 1 to 5 carbon atoms or an aryl group having 6 to 10 carbon atoms, and $X^{2a}$ is a structure represented by the following formula (a3):

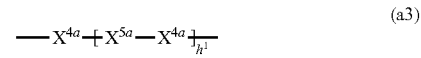

wherein $X^{4a}$ represents an alkylene group having 1 to 8 carbon atoms, an arylene group having 6 to 20 carbon atoms, or a divalent group derived from a heterocyclic compound having 8 to 20 carbon atoms, $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and halogen, $X^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group, $h^1$ represents the number of repeating units of the structure within parentheses including 0, $X^{4a}$'s in the number of $h^1+1$ and $X^{5a}$'s in the number of $h^1$ may be the same as or different from each other, $R^{2a}$ has the same definition as described above, and $X^{2a-}$ is an organic anion;

a resin whose solubility in alkali increases under the action of an acid and which includes an acrylic resin containing a structural unit derived from acrylic ester having a cyclic group containing —SO$_2$— or a cyclic group containing a lactone; and an organic solvent.

9. A method for producing a plated molded article, comprising plating the copper substrate with a mold produced by the method according to claim 8 to form a plated molded article within the mold.

10. A method for suppressing occurrence of footing in a cross-sectional shape of a resist pattern, the method comprising:

applying a chemically amplified positive-type photosensitive resin composition to a copper substrate, wherein said chemically amplified positive-type photosensitive resin composition is capable of forming a thick film having a film thickness of 10 μm or more on the copper substrate, said chemically amplified positive-type photosensitive resin composition comprising:

a compound having a carboxyl group represented by general formula (a1) below, wherein the compound having a carboxyl group is an acid generator (PAG) which is capable of producing an acid when irradiated with an active beam or radiation;

$$Y\text{—}(X\text{—}(COOH)_t)_u \quad (a1)$$

wherein X is a linking group having a valence of t+1, t and u each independently are an integer of 1 or more, Y is a PAG group represented by the following formula (a2), except that hydrogen atoms in the number of u are removed from at least one of the $R^{1a}$ moieties in the formula (a2):

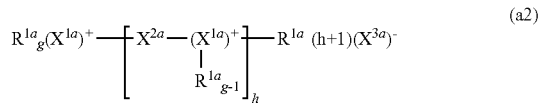

wherein $X^{1a}$ represents a sulfur atom having a valence of g or an iodine atom, g is 1 or 2, h represents the number of repeating units in the structure within parentheses including 0, $R^{1a}$ is an organic group that is bonded to $X^{1a}$, and represents an aryl group having 6 to 30 carbon atoms, a heterocyclic group having 4 to 30 carbon atoms, or an alkyl group having 1 to 30 carbon atoms, $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen, the number of $R^{1a}$'s is g+h(g−1)+1, the $R^{1a}$'s may be respectively the same as or different from each other, the two or more $R^{1a}$s may be bonded to each other directly or via —O—, —S—, —SO—, —SO$_2$—, —NH—, —NR$^{2a}$—, —CO—, —COO—, —CONH—, an alkylene group having 1 to 3 carbon atoms, or a phenylene group to form a ring structure containing $X^{1a}$, $R^{2a}$ is an alkyl group having 1 to 5 carbon atoms or an aryl group having 6 to 10 carbon atoms, and $X^{2a}$ is a structure represented by the following formula (a3):

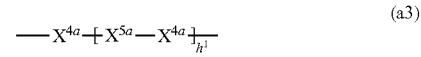

wherein $X^{4a}$ represents an alkylene group having 1 to 8 carbon atoms, an arylene group having 6 to 20 carbon atoms, or a divalent group derived from a heterocyclic compound having 8 to 20 carbon atoms, $X^{4a}$ may be substituted with at least one selected from the group consisting of an alkyl group having 1 to 8 carbon atoms, an alkoxy group having 1 to 8 carbon atoms, an aryl group having 6 to 10 carbon atoms, a hydroxyl group, a cyano group, a nitro group, and halogen, $X^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group, $h^1$ represents the number of repeating units of the structure within parentheses including 0, $X^{4a}$'s in the number of $h^1+1$ and $X^{5a}$'s in the number of $h^1$ may be the same as or different from each other, $R^{2a}$ has the same definition as described above, and $X^{2a-}$ is an organic anion;

a resin whose solubility in alkali increases under the action of an acid and which includes an acrylic resin containing a structural unit derived from acrylic ester having a cyclic group containing —SO$_2$— or a cyclic group containing a lactone; and an organic solvent.

* * * * *